(12) United States Patent
Wong

(10) Patent No.: US 10,971,579 B2
(45) Date of Patent: Apr. 6, 2021

(54) SEMICONDUCTOR DEVICE AND FABRICATION METHOD THEREOF

(71) Applicant: INNOSCIENCE (ZHUHAI) TECHNOLOGY CO., LTD., Zhuhai (CN)

(72) Inventor: King Yuen Wong, Hong Kong (HK)

(73) Assignee: INNOSCIENCE (ZHUHAI) TECHNOLOGY CO., LTD., Zhuhai (CN)

(*) Notice: Subject to any disclaimer, the term of this patent is extended or adjusted under 35 U.S.C. 154(b) by 0 days.

(21) Appl. No.: 16/563,960

(22) Filed: Sep. 9, 2019

(65) Prior Publication Data

US 2020/0350399 A1 Nov. 5, 2020

(30) Foreign Application Priority Data

Apr. 30, 2019 (CN) .......................... 201910363371.9

(51) Int. Cl.
| | | |
|---|---|---|
| H01L 29/66 | (2006.01) | |
| H01L 29/40 | (2006.01) | |
| H01L 29/737 | (2006.01) | |
| H01L 29/778 | (2006.01) | |
| H01L 21/8252 | (2006.01) | |
| H01L 29/20 | (2006.01) | |
| H01L 27/085 | (2006.01) | |
| H01L 29/06 | (2006.01) | |

(52) U.S. Cl.
CPC ........ H01L 29/0615 (2013.01); H01L 29/404 (2013.01); H01L 29/66318 (2013.01); H01L 29/66462 (2013.01); H01L 29/737 (2013.01); H01L 29/7787 (2013.01)

(58) Field of Classification Search
CPC ............. H01L 29/0615; H01L 29/7787; H01L 29/404; H01L 29/737; H01L 29/66318; H01L 29/66462
See application file for complete search history.

(56) References Cited

U.S. PATENT DOCUMENTS

| | | |
|---|---|---|
| 8,890,168 B2 | 11/2014 | Lidow et al. |
| 9,076,854 B2 | 7/2015 | Liu et al. |
| 2004/0201038 A1* | 10/2004 | Kimura ............... H01L 29/7787 257/192 |
| 2005/0121729 A1* | 6/2005 | Beach ............... H01L 21/76289 257/374 |

(Continued)

OTHER PUBLICATIONS

Posthuma, N. E. et al. "Gate architecture design for enhancement mode p-GaN gate HEMTs for 200 and 650V applications." 2018 IEEE 30th International Symposium on Power Semiconductor Devices and ICs (ISPSD), May 13, 2018, pp. 188-191.

(Continued)

*Primary Examiner* — Herve-Louis Y Assouman
(74) *Attorney, Agent, or Firm* — Idea Intellectual Limited; Margaret A. Burke; Sam T. Yip

(57) ABSTRACT

The present disclosure provides a semiconductor device and a fabrication method thereof. The semiconductor device includes a substrate, a doped group III-V layer, a conductor structure, and a metal layer. The doped group III-V layer is disposed on the substrate. The conductor structure is disposed on the doped group III-V layer. The metal layer is disposed between the conductor structure and the doped group III-V layer.

20 Claims, 23 Drawing Sheets

(56) References Cited

U.S. PATENT DOCUMENTS

| | | | |
|---|---|---|---|
| 2008/0073670 A1* | 3/2008 | Yang | H01L 29/404 |
| | | | 257/194 |
| 2013/0113018 A1 | 5/2013 | Wakita et al. | |
| 2013/0187627 A1* | 7/2013 | Imada | H01L 27/088 |
| | | | 323/311 |
| 2013/0240901 A1* | 9/2013 | Kohda | H01L 29/2003 |
| | | | 257/76 |
| 2015/0318387 A1* | 11/2015 | Chiu | H01L 21/02164 |
| | | | 257/76 |
| 2016/0086938 A1 | 3/2016 | Kinzer | |

OTHER PUBLICATIONS

European search report of corresponding European Patent Application No. 19209343.3 dated Jun. 5, 2020.

* cited by examiner

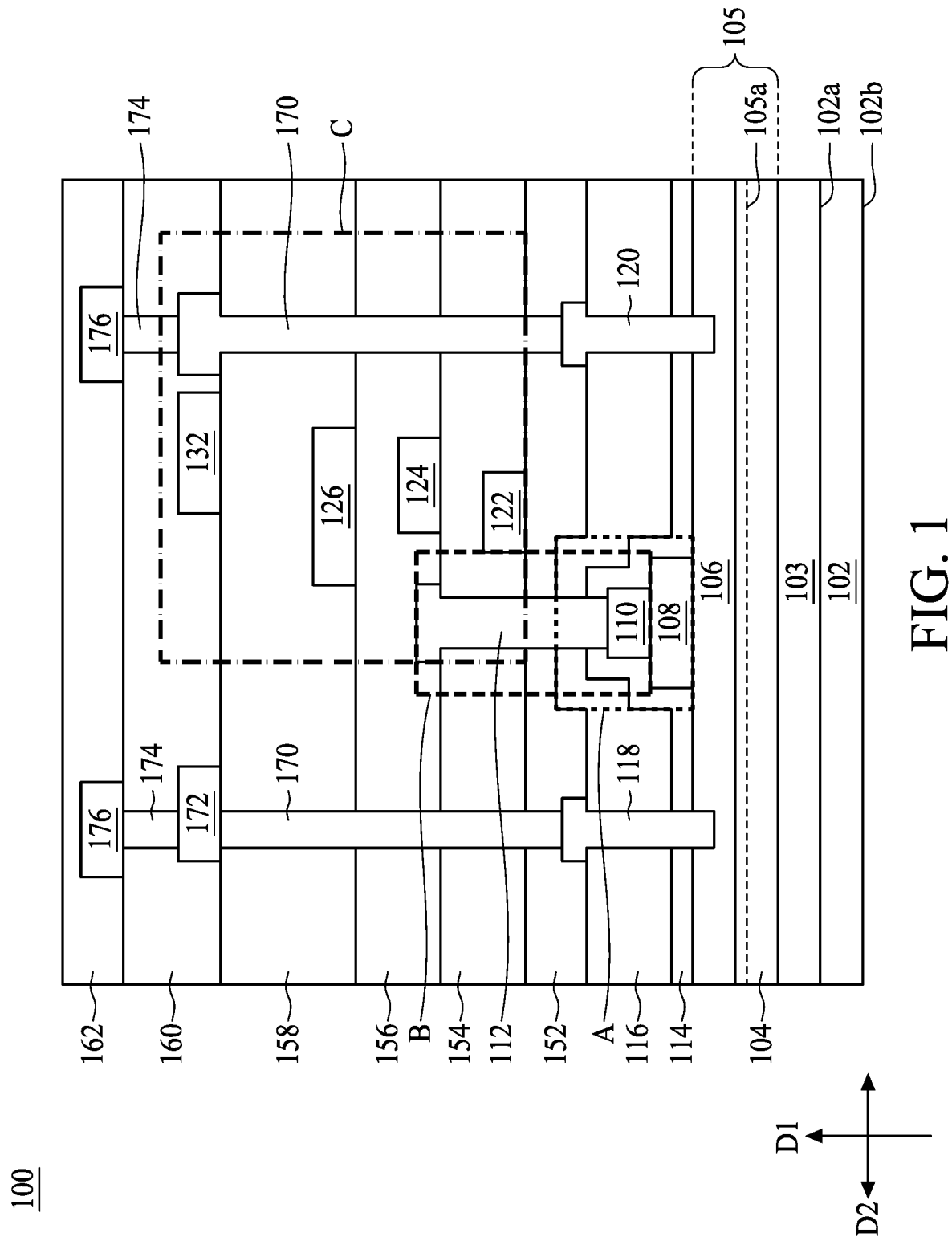

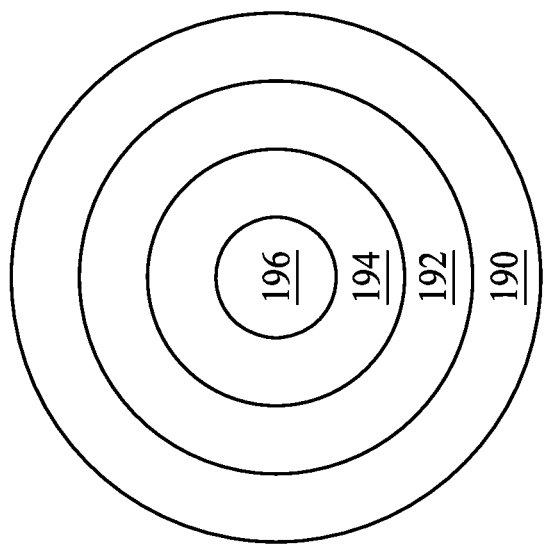
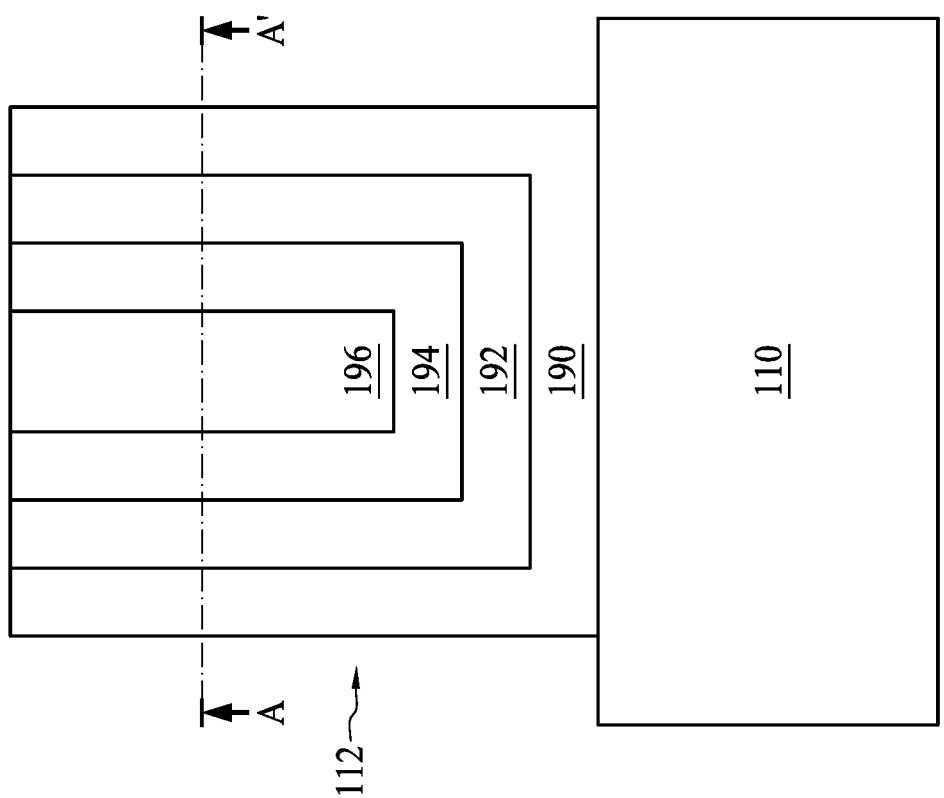

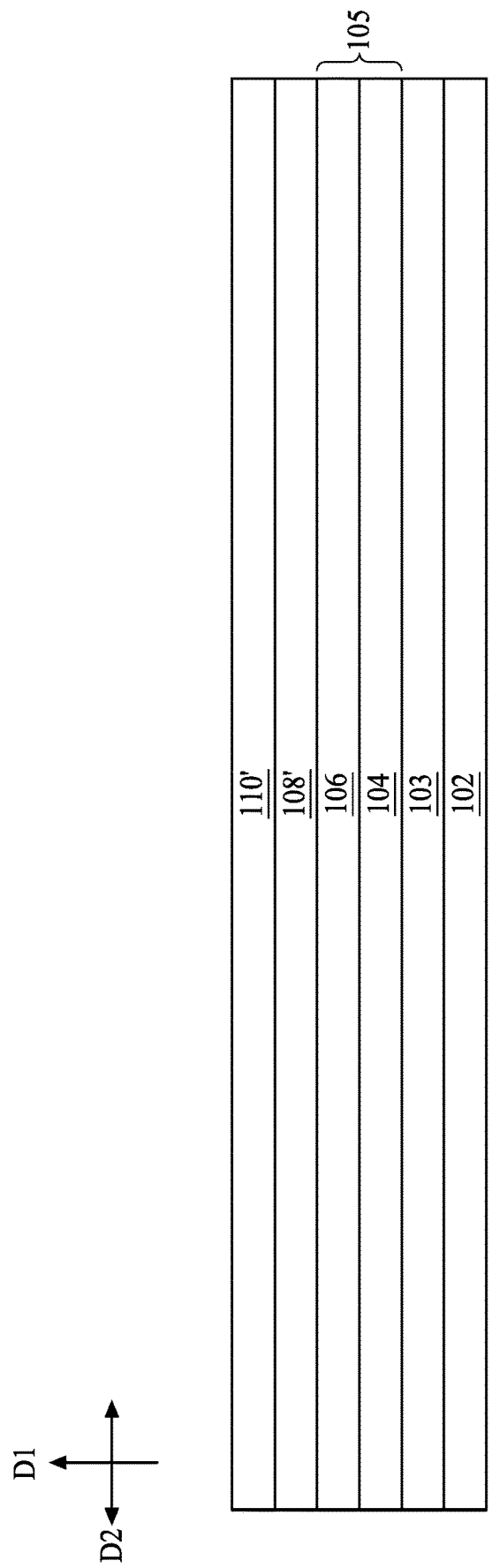

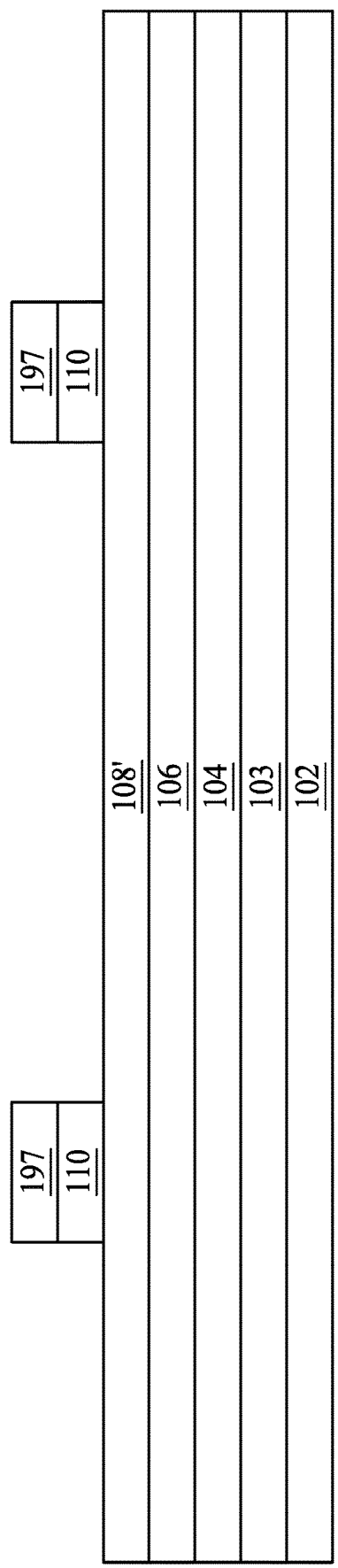

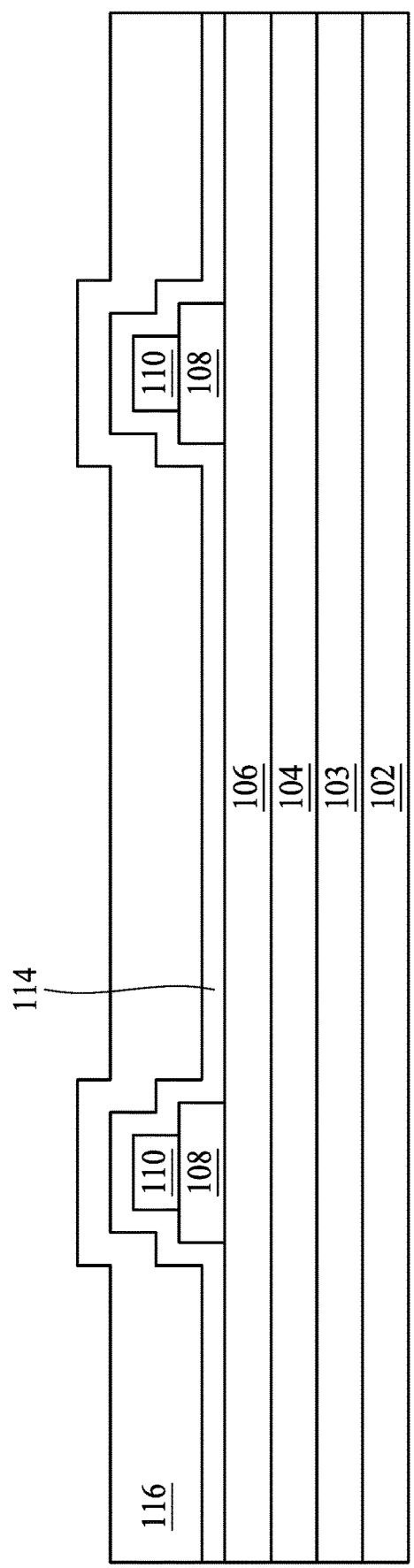

SEMICONDUCTOR DEVICE AND FABRICATION METHOD THEREOF

CROSS-REFERENCE TO RELATED APPLICATION(S)

This non-provisional application claims priority under 35 U.S.C. § 119(a) to Patent Application No. 201910363371.9, filed in China (P.R.C.) on Apr. 30, 2019 and the entire contents of which are hereby incorporated by reference.

BACKGROUND

1. Technical Field

The present disclosure relates to a semiconductor device and a fabrication method thereof, and more particularly to a semiconductor device having a doped group III-V layer, a conductor structure, and a metal layer.

2. Description of the Related Art

Components including direct bandgap semiconductors, for example, semiconductor components including group III-V materials or group III-V compounds (Category: III-V compounds) can operate or work under a variety of conditions or in a variety of environments (e.g., at different voltages and frequencies) due to their characteristics.

The semiconductor components may include a heterojunction bipolar transistor (HBT), a heterojunction field effect transistor (HFET), a high-electron-mobility transistor (HEMT), a modulation-doped FET (MODFET) and the like.

SUMMARY OF THE INVENTION

In some embodiments of the present disclosure, a semiconductor device is provided, which includes a substrate, a doped group III-V layer, a conductor structure, and a metal layer. The doped group III-V layer is disposed on the substrate. The conductor structure is disposed on the doped group III-V layer. The metal layer is disposed between the conductor structure and the doped group III-V layer.

In some embodiments of the present disclosure, a semiconductor apparatus is provided, which includes a superlattice layer, a first portion, a second portion, and an insulation region that separates the first portion from the second portion. The first portion is formed on the superlattice layer and includes a semiconductor device as described above. The second portion is formed on the superlattice layer. The second portion has a voltage lower than that of the first portion.

In some embodiments of the present disclosure, a method for manufacturing a semiconductor device is provided. The method includes providing a substrate, and forming a doped group III-V layer on the substrate. The method for manufacturing a semiconductor device further includes forming a conductor structure on the doped group III-V layer, and forming a metal layer between the conductor structure and the doped group III-V layer.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

FIG. 1 is a side view of a semiconductor device according to certain embodiments of the present disclosure;

FIG. 3A is an enlarged view of the structure in the dashed line box B of FIG. 1;

FIG. 3B is a plan and cross-sectional view of a conductor structure 112 along the line AA' in FIG. 3A;

FIGS. 8A, 8B, 8C, 8D, 8E, 8F, 8G, 8H, 8I, 8J, 8K, 8L and 8M illustrate several operations in manufacturing a semiconductor device according to certain embodiments of the present invention.

PREFERRED EMBODIMENT OF THE PRESENT INVENTION

Figure 2B:
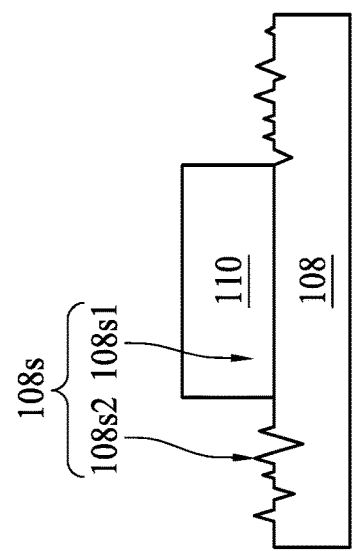
FIG. 2B is an enlarged view of the structure in the dashed line box D of FIG. 2A.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

Direct bandgap materials, such as group III-V compounds, may include, but are not limited to, for example, gallium arsenide (GaAs), indium phosphide (InP), gallium nitride (GaN), indium gallium arsenide (InGaAs), aluminum gallium arsenide (InAlAs), and others.

FIG. 1 shows a semiconductor device 100 according to certain embodiments of the present disclosure.

As shown in FIG. 1, the semiconductor device 100 includes a substrate 102, a doped group III-V layer 108, a metal layer 110, and a conductor structure 112.

The substrate 102 may include, without limitation, silicon (Si), doped Si, silicon carbide (SiC), germanium silicide (SiGe), gallium arsenide (GaAs), or other semiconductor materials. The substrate 102 may include, without limitation, sapphire, silicon on insulator (SOI), or other suitable materials. In some embodiments, the substrate 102 may further include a doped region (not shown in FIG. 1), for example, a p-well, n-well, or the like. The substrate 102 has an active layer 102a and a back side 102b opposing the active layer 102a. An integrated circuit can be formed over the active layer 102a.

The doped group III-V layer 108 can be disposed on the substrate 102. The doped group III-V layer 108 can be stacked along a direction D1, or disposed on the substrate 102. The direction D1 is substantially perpendicular to another direction D2.

The doped group III-V layer 108 may include, without limitation, for example, doped gallium nitride (doped GaN), doped aluminum gallium nitride (doped AlGaN), doped indium gallium nitride (doped InGaN), and other doped III-V compounds. The doped group III-V layer 108 may include, without limitation, for example, a p-type dopant, an n-type dopant, or other dopants. In some embodiments, exemplary dopants can include, for example, but are not limited to, magnesium (Mg), zinc (Zn), cadmium (Cd), silicon (Si), germanium (Ge), and the like.

The metal layer 110 is located on the doped group III-V layer 108. In some embodiments, the metal layer 110 may include, without limitation, for example, a refractory metal or a compound thereof. For example, the metal layer 110 may include, without limitation, for example niobium (Nb), molybdenum (Mo), tantalum (Ta), tungsten (W), rhenium (Re), titanium (Ti), vanadium (V), chromium (Cr), zirconium (Zr), hafnium (Hf), ruthenium (Ru), osmium (Os), iridium (Ir) and other metals, or compounds of these metals, such as tantalum nitride (TaN), titanium nitride (TiN), and tungsten carbide (WC), etc.

The conductor structure 112 is disposed on the metal layer 110. The conductor structure 112 can include a gate structure. The conductor structure 112 can include a gate metal. In some embodiments, the gate metal may include, for example, but is not limited to, titanium (Ti), tantalum (Ta), tungsten (W), aluminum (Al), cobalt (Co), copper (Cu), nickel (Ni), platinum (Pt), lead (Pb), molybdenum (Mo) and compounds thereof (such as, but not limited to, titanium nitride (TiN), tantalum nitride (TaN), other conductive nitrides, or conductive oxides), metal alloys (such as aluminum-copper alloy (Al—Cu)), or other suitable materials.

The doped group III-V layer 108 can be in direct contact with the metal layer 110. The doped group III-V layer 108 can be electrically connected to the metal layer 110. The doped group III-V layer 108 is located below the metal layer 110 in the direction D1. The metal layer 110 is located above the doped group III-V layer 108 in the direction D1.

The conductor structure 112 is in direct contact with the metal layer 110. The conductor structure 112 can be electrically connected to the metal layer 110. The conductor structure 112 is located above the metal layer 110 in the direction D1. The metal layer 110 is located below the conductor structure 112 in the direction D1. The metal layer 110 is located between the conductor structure 112 and the doped group III-V layer 108.

The semiconductor device 100 may also include a group III-V layer 105 disposed on the substrate 102. The semiconductor device 100 may further include a superlattice layer 103 disposed on the substrate 102. The superlattice layer 103 can be located between the group III-V layer 105 and the substrate 102. The group III-V layer 105 may include a single-layer structure. The group III-V layer 105 may include a multi-layer structure.

The superlattice layer 103 may include a single-layer structure. The superlattice layer 103 may include a multi-layer structure or a multi-layer stack, for example, a multi-layer stack of AlN/GaN pairs. In some embodiments, the superlattice layer 103 can reduce the tensile stress of the semiconductor device 100. In some embodiments, the superlattice layer 103 can trap the electrodes diffused from the substrate 102 to the group III-V layer 105, thereby improving the performance and reliability of the device. In some embodiments, the superlattice layer 103 can reduce the electron trap. In some embodiments, the superlattice layer 103 can increase the thickness of the group III-V layer 105. In some embodiments, the superlattice layer 103 can enhance the breakdown voltage.

In some embodiments, the semiconductor device 100 may further include a buffer layer (not shown) disposed between the substrate 102 and the superlattice layer 103. In some embodiments, the buffer layer can promote the lattice match between the substrate 102 and the superlattice layer 103. In some embodiments, the buffer layer can include, without limitation, a nitride, for example, aluminum nitride (AlN), and aluminum gallium nitride (AlGaN).

The relatively thick superlattice layer (about 1 μm to 4 μm) may increase the overall size of the semiconductor device or structure. Where a superlattice layer is added, the defects caused by the material differences between adjacent layers, such as delamination or peel off, are required to be considered. In addition, adding a superlattice layer may increase the costs.

Although the addition of a superlattice layer may increase the overall size of the semiconductor device or structure, lead to the requirement to consider the defects caused by the material differences between adjacent layers, and increase the costs, the superlattice layer is provided in the semiconductor device 100, since the superlattice layer can block the diffusion of crystallographic defects (such as dislocation) in a relatively high voltage environment (for example, more than 200 V).

In order to prevent the defects (such as dislocation) from propagating from the underlying layers (such as the substrate 102 and the buffer layer) to the group III-V layer 105, a superlattice layer 103 may be added between the substrate 102 and the group III-V layer 105, to avoid the dysfunction of the semiconductor device 100.

The semiconductor device 100 may further include a passivation layer 114 disposed on the metal layer 110. In some embodiments, the passivation layer 114 may include, for example, without limitation, an oxide or a nitride, such as silicon nitride (SiN), silicon oxide (SiO2), and the like. The passivation layer 114 can include, for example, without limitation, a composite layer of an oxide and a nitride, such as Al2O3/SiN, Al2O3/SiO2, AlN/SiN, AlN/$SiO_2$, and the like.

The passivation layer 114 may surround the doped group III-V layer 108. The passivation layer 114 may cover the doped group III-V layer 108. The passivation layer 114 may surround the metal layer 110. The passivation layer 114 may cover the metal layer 110. The passivation layer 114 may cover a portion of the metal layer 110. The passivation layer 114 may surround the conductor structure 112. The passivation layer 114 may surround a portion of the conductor structure 112.

The semiconductor device 100 further includes a passivation layer 116 disposed on the passivation layer 114. The passivation layer 116 may surround the conductor structure 112. The passivation layer 116 may surround a portion of the conductor structure 112.

The semiconductor device 100 may also include other conductor structures. For example, the semiconductor device 100 may also include a source contact 118, a drain contact 120 or other conductor structures disposed on the substrate 102. Although the source contact 118 and the drain contact 120 are respectively disposed on two sides of the conductor structure 112 in FIG. 1, the source contact 118, the drain contact 120, and the conductor structure 112 may have different configurations in other embodiments of the present disclosure due to the design requirements.

In some embodiments, the source contact 118 and the drain contact 120 may include, for example, without limitation, a conductor material. The conductor materials may include, but is not limited to, for example, metals, alloys, doped semiconductor materials (e.g., doped crystalline silicon), or other suitable conductor materials.

A portion of the source contact 118 may be located in the group III-V layer 105. A portion of the drain contact 120 may be located in the group III-V layer 105. In some other embodiments, the source contact 118 may be disposed on the group III-V layer 104. In some other embodiments, the drain contact 120 may be disposed on the group III-V layer 104. The source contact 118 runs through the passivation layer 114 to contact the group III-V layer 106. The drain contact 120 runs through the passivation layer 114 to contact the group III-V layer 106.

The semiconductor device 100 may further include a dielectric layer 152, a dielectric layer 154, a dielectric layer 156, a dielectric layer 158, a dielectric layer 160, and a dielectric layer 162.

The semiconductor device 100 may further include a field plate 122, a field plate 124, a field plate 126, and a field plate 132.

The field plate 122, the field plate 124, the field plate 126, and the field plate 132 are not in contact with each other. The field plate 122, the field plate 124, the field plate 126, and the field plate 132 are spaced apart from each other. The field plate 122 can be at zero potential. The field plate 124 can be at zero potential. The field plate 126 can be at zero potential. The field plate 132 can be at zero potential.

The field plate 122 can be connected to the source contact 118 and/or the drain contact 120 via other conductor structures The field plate 124 can be connected to the source contact 118 and/or the drain contact 120 via other conductor structures The field plate 126 can be connected to the source contact 118 and/or the drain contact 120 via other conductor structures The field plate 132 can be connected to the source contact 118 and/or the drain contact 120 via other conductor structures The field plate 122 is not in direct contact with the source contact 118. The field plate 122 is not in direct contact with the drain contact 120. The field plate 124 is not in direct contact with the source contact 118. The field plate 124 is not in direct contact with the drain contact 120. The field plate 126 is not in direct contact with the source contact 118. The field plate 126 is not in direct contact with the drain contact 120. The field plate 132 is not in direct contact with the source contact 118. The field plate 132 is not in direct contact with the drain contact 120.

The dielectric layer 152 is located between the field plate 122 and the source contact 118 in the direction D1. The dielectric layer 152 is located between the field plate 124 and the source contact 118 in the direction D1. The dielectric layer 154 is located between the field plate 124 and the source contact 118 in the direction D1. The dielectric layer 152 is located between the field plate 126 and the source contact 118 in the direction D1. The dielectric layer 154 is located between the field plate 126 and the source contact 118 in the direction D1. The dielectric layer 156 is located between the field plate 126 and the source contact 118 in the direction D1. The dielectric layer 152 is located between the field plate 132 and the source contact 118 in the direction D1. The dielectric layer 154 is located between the field plate 132 and the source contact 118 in the direction D1. The dielectric layer 156 is located between the field plate 132 and the source contact 118 in the direction D1. The dielectric layer 158 is located between the field plate 132 and the source contact 118 in the direction D1.

The field plate 122 is adjacent to the conductor structure 112 in the direction D2. The field plate 124 is adjacent to the conductor structure 112 in the direction D2.

The field plate 124 is partially overlapped with the field plate 122 in the direction D1. The field plate 126 is partially overlapped with the field plate 122 in the direction D1. The field plate 132 is partially overlapped with the field plate 122 in the direction D1.

The semiconductor device 100 may further include an interconnect structure 170. The semiconductor device 100 may further include a metal layer 172, and a metal layer 176. The semiconductor device 100 may further include a conductive via 174.

The group III-V layer 105 can have an electron channel region 105a as shown by the dashed line. The electron channel region 105a may include a two-dimensional electron gas (2DEG) region, and the 2DEG region is generally readily available in a heterostructure. In the 2DEG region, the electron gas can move freely in a two-dimensional direction (for example, the direction D2), but is limited in the movement in a third dimension (for example, the direction D1).

The group III-V layer 105 may include a single-layer structure. The group III-V layer 105 may include a multi-layer structure. The group III-V layer 105 can include a heterostructure.

The group III-V layer 105 can include a group III-V layer 104. The group III-V layer 104 can include, without limitation, a group III nitride, for example, a compound $In_xAl_yGa_{1-x-y}N$, in which $x+y \leq 1$. The group III nitride further includes, but is not limited to, for example, a compound $Al_yGa_{(1-y)}N$, in which $y \leq 1$.

The semiconductor device 100 further includes a group III-V layer 106 disposed on the group III-V layer 104. The group III-V layer 106 can include, without limitation, a group III nitride, for example, a compound $In_xAl_yGa_{1-x-y}N$, in which $x+y \leq 1$. The group III nitride further includes, but is not limited to, for example, a compound $Al_yGa_{(1-y)}N$, in which $y \leq 1$. The group III-V layer 106 can have a higher bandgap than that of the group III-V layer 104. For example, the group III-V layer 104 can include a GaN layer having a bandgap of about 3.4 V. The group III-V layer 106 can include AlGaN having a band gap of about 4. The 2DEG region is typically formed in a layer with a small bandgap, such as GaN. A heterojunction is formed between the group III-V layer 106 and the group III-V layer 104, and the polarization of the heterojunction of different nitrides forms a 2DEG region in the group III-V layer 104. The group III-V layer 104 can provide or remove electrons in the 2DEG region, thereby controlling the conduction of the semiconductor device 100.

In some embodiments, the group III-V layer 105 has an actual channel (electron channel region 105a) formed under the conductor structure 112, and is preset to be in an ON state when the conductor structure 112 is in a zero bias state. Such a device is referred to as a depletion-mode device.

An enhancement-mode device is a counterpart of the depletion-mode device. The enhancement-mode device is preset to be in an OFF state when the conductor structure 112 is in a zero bias state. Applying a voltage across the conductor structure 112 induces electrons or charges in a region below the conductor structure 112, which may be referred to as an electron or charge inversion layer. As the voltage increases, the number of electrons or charges that are induced increases. The minimum voltage that is applied to form the inversion layer is called the threshold voltage, expressed as Vth.

When the conductor structure 112 is in a zero bias state, and the electron channel region 105a is depleted or removed, the semiconductor device 100 can be an enhancement-mode device. In some embodiments, the doped group III-V layer 108 can form a PN junction with the group III-V layer 105, and the PN junction can be used to deplete the electronic channel region 105a. Since the PN junction depletes the electron channel region 105a, when the conductor structure 112 is in a zero bias state, no current flows through the semiconductor device 100, that is, the threshold voltage of the semiconductor device 100 is a positive value. The doped group III-V layer 108 facilitates the reduction of the leakage current and the increase of the threshold voltage.

The metal layer 110 can serve as a stop layer or protective layer for the doped group III-V layer 108 during the fabrication of the device 100. For example, the metal layer 110 can cause the unexposed surface of the doped group III-V layer 108 to remain substantially relatively flat during the application of a removal technique, such as etching technique. The metal layer 110 helps to increase the bias control of the conductor structure 112. The metal layer 110 helps to increase the switching speed of the gate. The metal layer 110 helps to reduce the leakage current and increase the threshold voltage.

The conductor structure 112 reduces the overall resistance of the gate contact structure and is used to provide a low-resistance wire that can be further used to electrically connect to other conductors. The gate contact structure can include, without limitation, for example, a conductor structure 112, a metal layer 110, and a doped group III-V layer 108.

Figure 2A:
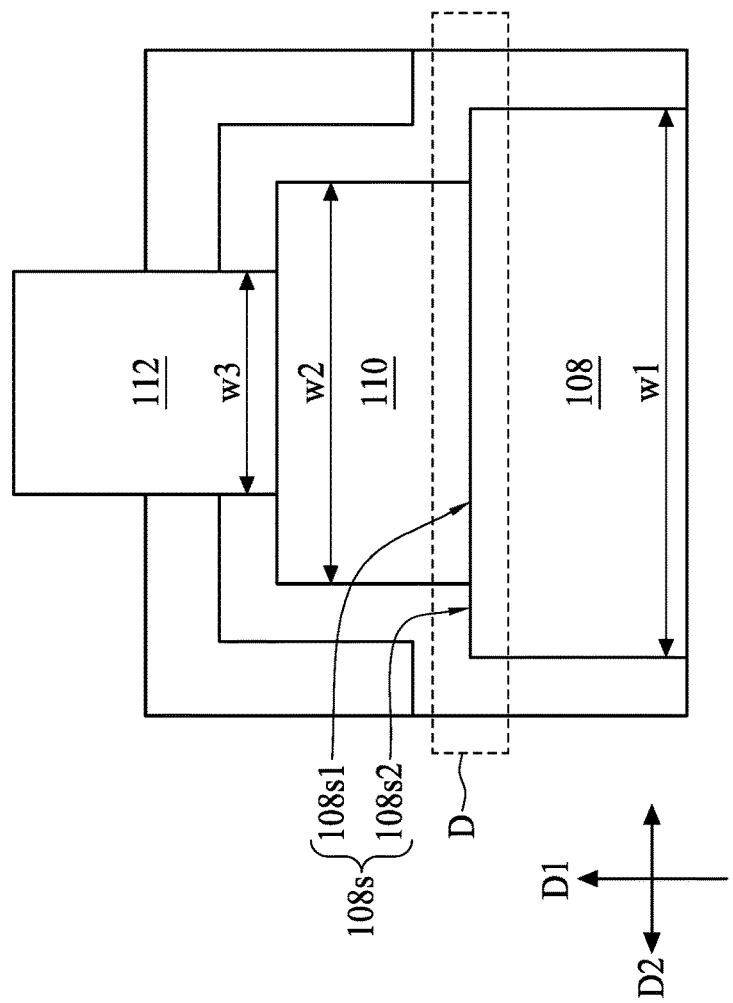
FIG. 2A is an enlarged view of the structure in the dashed line box A of FIG. 1.

FIG. 2A is an enlarged view of the structure in the dashed line box A of FIG. 1.

Referring to FIG. 2A, the doped group III-V layer 108 has a width w1 in the direction D2. The direction D2 can also be referred to as the width direction. In some embodiments, the width w1 is greater than about 0.5 micrometer (µm). In some embodiments, the width w1 is in the range of about 0.5 µm to about 1.5 µm. In some embodiments, the width w1 is in the range of about 0.8 µm to about 1.2 µm. In some embodiments, the width w1 is about 1.0 µm.

In some embodiments, the metal layer 110 has a width w2 in the direction D2. In some embodiments, the width w2 is greater than about 0.4 µm. In some embodiments, the width w2 is in the range of about 0.4 µm to about 1.2 µm. In some embodiments, the width w2 is less than the width w1.

In some embodiments, the conductor structure 112 has a width w3 in the direction D2. In some embodiments, the width w3 is greater than about 0.3 µm. In some embodiments, the width w3 is in the range of about 0.3 µm to about 0.8 µm. In some embodiments, the width w3 is less than the width w2. In some embodiments, the width w3 is less than the width w1. In some embodiments, the width w2 is less than the width w1 and greater than the width w3.

In some embodiments, the doped group III-V layer 108 has a top surface 108s. The top surface 108s has a portion 108s1 and another portion 108s2 surrounding the portion 108s1. In some embodiments, the portion 108s1 of the doped group III-V layer 108 is in direct contact with the metal layer 110, and the second portion 108s2 is in direct contact with the passivation layer 114.

FIG. 2B is an enlarged view of the structure in the dashed line box D of FIG. 2A. Referring to FIG. 2B, the portion 108s1 and the portion 108s2 have a different surface roughness. In some embodiments, the portion 108s1 has a relatively small surface roughness compared to the portion 108s2. The metal layer 110 can serve as a stop or protective layer for the doped group III-V layer 108 during the fabrication of the semiconductor device 100 such that the unexposed surface 108s1 of the doped group III-V layer 108 (or a portion of the surface 108s1 covered by the metal layer 110) is relatively flat after performing a removal operation such as, but not limited to, an etching operation. The surface 108s2 of the doped group III-V layer 108 that is not masked by the metal layer 110 may be relatively rough after performing a removal operation such as, but not limited to, an etching operation, for example a relatively uneven surface as shown. The surface 108s2 can have protrusions and depressions.

FIG. 3A is an enlarged view of the semiconductor device 100 of FIG. 1 according to an embodiment of the present invention. FIG. 3B is a plan and cross-sectional view along the line AA' of FIG. 3A according to an embodiment of the present invention. In some embodiments, the conductor structure 112 can include a structure of a single material. In some embodiments, the conductor structure 112 can include a structure of heterogeneous materials. In some embodiments, as shown in FIG. 3B, the conductor structure 112 can include several heterojunction junctions. In some embodiments, the conductor structure 112 may include a plurality of layers, such as a layer 190, a layer 192, a layer 194, and a layer 196. Although FIGS. 3A and 3B depict that the conductor structure 112 has four layers, the present invention is not limited thereto. In other embodiments, the conductor structure 112 may include a structure that have 4 more or less layers.

In some embodiments, the layer 190 may include, without limitation, for example, a refractory metal or a compound thereof. The layer 190 can include a material that is the same as or similar to that of the metal layer 110. The layer 190 can include a material that is different from that of the metal layer 110. In some embodiments, the layer 192 can include, without limitation, for example a metal or metal compound such as titanium, chromium, tungstate titanate, and the like. The layer 192 can serve as a wetting layer to aid subsequent metal filling In some embodiments, the layer 194 can include, without limitation, for example, a gate metal. The layer 194 can include a material that is the same as or similar to that of the conductor structure 112. The layer 194 can include a material that is different from that of the conductor structure 112. In some embodiments, the layer 196 may include, without limitation, for example, a refractory metal or a compound thereof. The layer 196 can include a material that is the same as or similar to that of the metal layer 110. The layer 196 can include a material that is different from that of the metal layer 110.

Figure 4:
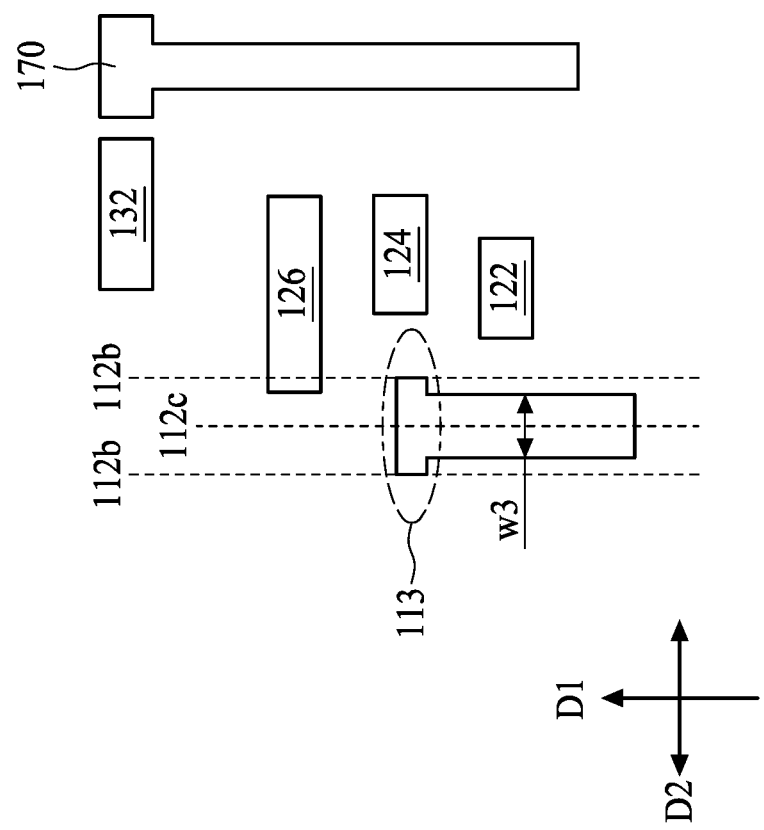
FIG. 4 is an enlarged view of partial structure in the dashed line box C of FIG. 1.

FIG. 4 is an enlarged view of partial structure in the dashed line box C of FIG. 1. Referring to FIG. 4, in some embodiments, the conductor structure 112 has an overhang 113 having a width greater than the width w3, where the width w3 is a relatively small width of the conductor structure 112. The conductor structure 112 can have a centerline 112c that passes through a center point of the width w3. In some embodiments, the centerline 112c does not pass through the center point of the overhang 113. In some embodiments, the centerline 112c passes through the center point of the overhang 113.

The boundary line 112b may pass or overlap the boundary of the conductor structure 112. In other embodiments, the conductor structure 112 may not have the overhang 113, and the boundary line 112b is spaced from the centerline 112c by about half the width w3.

As shown in FIG. 4, in some embodiments, the field plate 126 partially overlaps the conductor structure 112 in the direction D1. The field plate 126 has a portion located between the boundary line 112b and the centerline 112c in the direction D1. The boundary line 112b penetrates through the field plate 126 in the direction D2.

In other embodiments, the field plate 126 may not overlap the conductor structure 112 in the direction D1. In other embodiments, the field plate 126 may not overlap the centerline 112c of the conductor structure 112 in direction D1.

The field plate 122 is located between the conductor structure 112 and the drain contact 120 in the direction D2. The field plate 124 is located between the conductor structure 112 and the drain contact 120 in the direction D2. The field plate 126 is located between the conductor structure 112 and the drain contact 120 in the direction D2. The field plate 132 is located between the conductor structure 112 and the drain contact 120 in the direction D2.

In some embodiments, the distance from the boundary line 112b to the boundary of the field plate 122 is between about 0.5 µm to 2.5 µm. The distance from the boundary line 112b to the boundary of the field plate 124 is between about 2 µm to 4 µm. The distance from the boundary line 112b to the boundary of the field plate 126 is between about 3 µm to 5 µm. The distance from the boundary line 112b to the boundary of the field plate 132 is between about 6 µm to 8 µm.

In some embodiments, the field plate (e.g., the field plate 122, the field plate 124, the field plate 126, and/or the field plate 132) has a width in the direction D2 of between about 50 nm to 150 nm. In some embodiments, the field plate has a width in the direction D2 of between about 80 nm to 120 nm. In some embodiments, the field plate has a width in the direction D2 of between about 90 nm to 110 nm. It should be noted that the values of the width, the distance, and the like described in the present disclosure are merely exemplary, and the present invention is not limited thereto. In some embodiments, these values can be adjusted according to the actual application of the present invention without departing from the spirit of the present invention.

In a relatively high voltage (e.g. voltage between the gate and the drain) component (e.g. components suitable for use at a voltage of greater than or equal to 600 V), in order to increase the tolerance to voltage, the distance between the conductor structures (e.g. distance between the gate and the drain) is generally designed to be 15 µm or more, which is usually 5 times the length of a relatively low voltage component (for example, components suitable for use at a voltage of between 10 V and 100 V). For example, if the semiconductor component 100 is suitable for use at a voltage of greater than 600 V, the distance between the conductor structure 112 and the drain contact 120 is generally greater than 15 µm.

The field plate 122 can reduce the electric field of the gate contact structure and increase the threshold voltage. The field plate 124 can reduce the electric field of the gate contact structure and increase the threshold voltage. The field plate 126 can reduce the electric field of the gate contact structure and increase the threshold voltage. The field plate 132 can reduce the electric field of the gate contact structure and increase the threshold voltage.

The field plate 122 allows the electric field between the conductor structures (for example, the conductor structure 112, the source contact 118, and the drain contact 120) to distribute evenly, improves the tolerance to voltage, and permit the voltage to release slowly, thereby improving the device reliability. The field plate 124 allows the electric field between the conductor structures (for example, the conductor structure 112, the source contact 118, and the drain contact 120) to distribute evenly, improves the tolerance to voltage, and permit the voltage to release slowly, thereby improving the device reliability. The field plate 126 allows the electric field between the conductor structures (for example, the conductor structure 112, the source contact 118, and the drain contact 120) to distribute evenly, improves the tolerance to voltage, and permit the voltage to release slowly, thereby improving the device reliability. The field plate 132 allows the electric field between the conductor structures (for example, the conductor structure 112, the source contact 118, and the drain contact 120) to distribute evenly, improves the tolerance to voltage, and permit the voltage to release slowly, thereby improving the device reliability.

In some embodiments, there is at least one dielectric layer (e.g., dielectric layer 152, dielectric layer 154, dielectric layer 156, and dielectric layer 158) between the field plate 122, the field plate 124, the field plate 126, and/or the field plate 132 and the conductor structure. This configuration allows for a smaller distance between the conductor structures and avoids an increase in resistance.

Although the drawing of the present disclosure depicts that the semiconductor device 100 has four field plates, the present disclosure is not limited thereto. In some embodiments, the semiconductor device 100 may include 4 more or less field plates.

Figure 5:
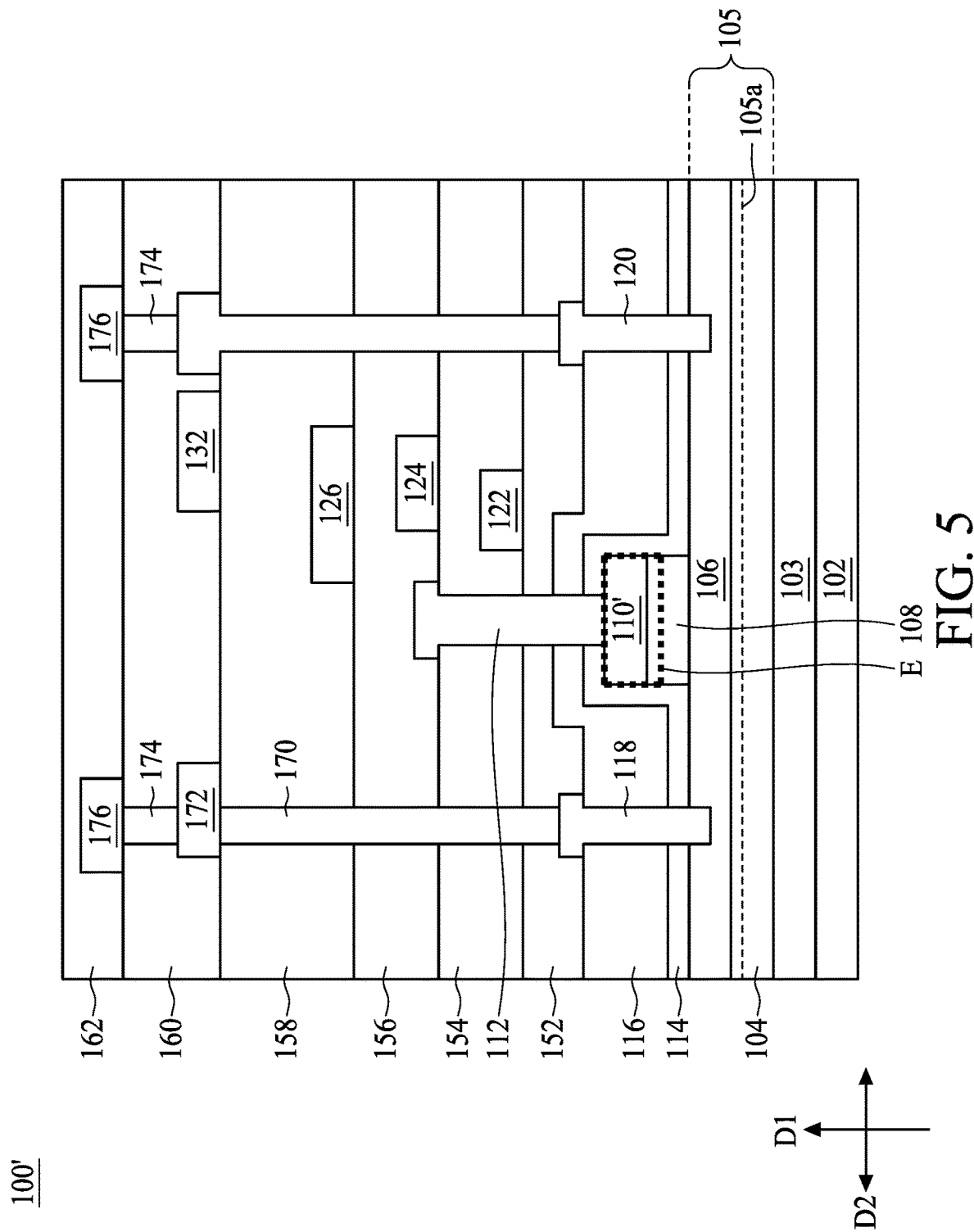
FIG. 5 shows another semiconductor device according to certain embodiments of the present disclosure.

FIG. 5 depicts a semiconductor device 100' according to an embodiment of the present disclosure. The semiconductor device 100' has a structure similar to the semiconductor device 100 shown in FIG. 1, except that the metal layer 110 of the semiconductor device 100 is replaced by a metal layer 110' to form a semiconductor device 100'. The metal layer 110' has a width greater than that of the metal layer 110. The metal layer 110' can cover the doped group III-V layer 108. The metal layer 110' can completely cover the doped group III-V layer 108. The edge of the metal layer 110' can align with the edge of the doped group III-V layer 108.

Figure 6:
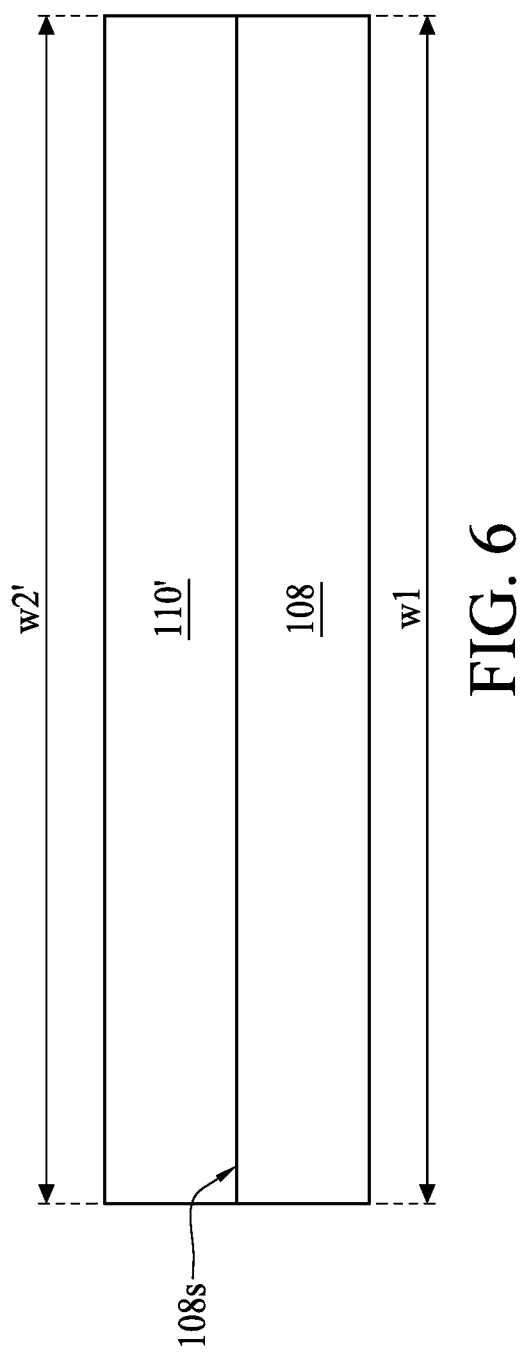
FIG. 6 is an enlarged view of the structure in the dashed line box E of FIG. 5.

FIG. 6 is an enlarged view of the structure in the dashed line box E of FIG. 5. The width w1 of the doped group III-V layer 108 as shown in FIG. 6 may be substantially equal to the width w2' of the metal layer 110'. The doped group III-V layer 108 has a substantially flat top surface 108s.

In the semiconductor device 100', the metal layer 110' can serve as a stop layer or a protective layer to protect the entire top surface of the doped group III-V layer 108, so that no protrusions and depressions (or relatively uneven surfaces) will be produced on the surface of the doped group III-V layer 108 by the removal operation (for example, etching). In the semiconductor device 100, since the width w2 is smaller than the width w1, the flow path of the electron from the conductor structure 112 to the electron channel region 105a is longer than that in the case where the width w2' is equal to the width w1 in the semiconductor device 100', contributing to the reduction of leakage current.

Figure 7:
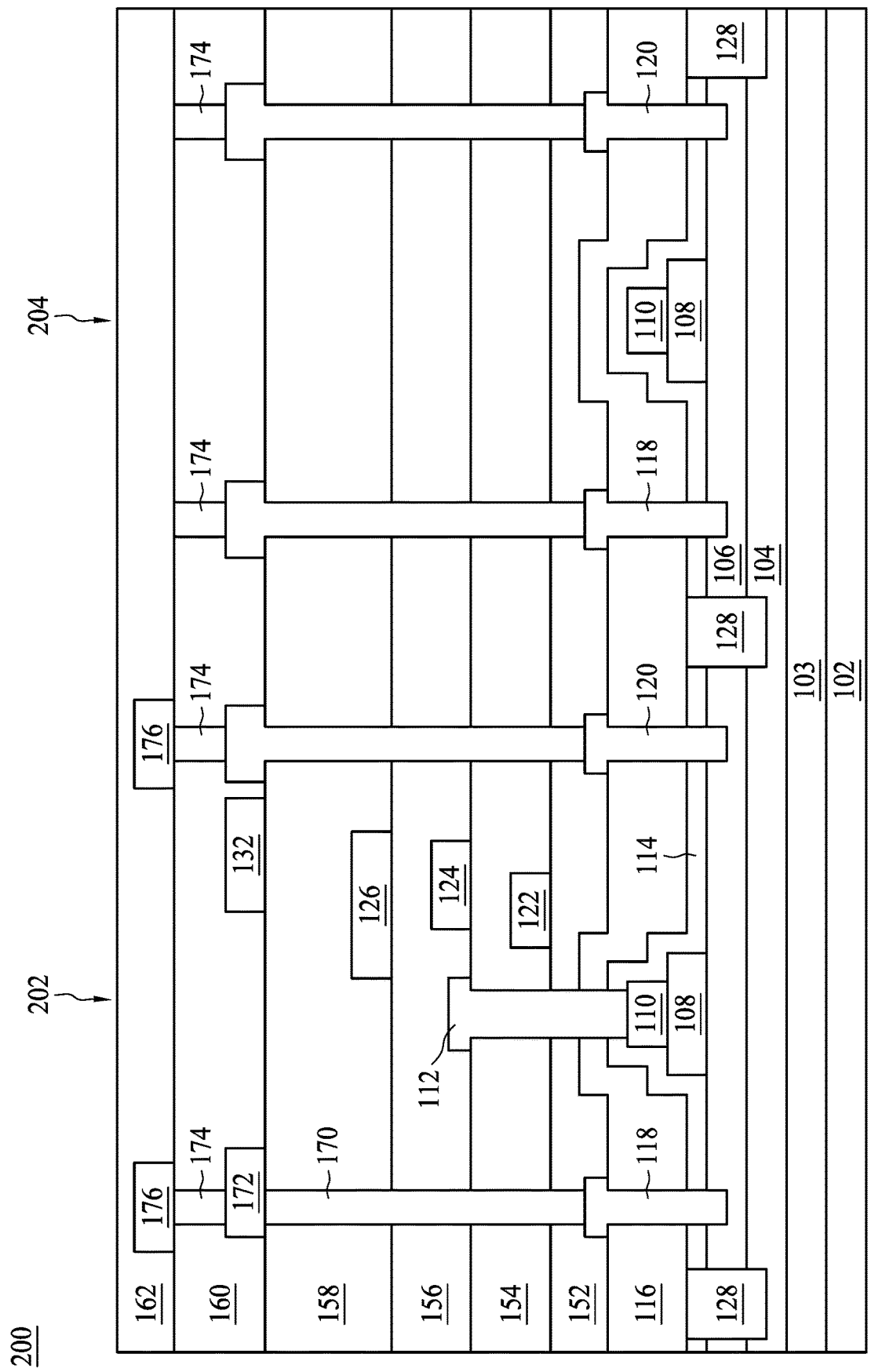
FIG. 7 shows another semiconductor device according to certain embodiments of the present disclosure.

FIG. 7 depicts a semiconductor device 200 according to an embodiment of the present disclosure. In some embodiments, the semiconductor device 200 has a portion 202, another portion 204, and an insulation region 128 that separates the portion 202 from the portion 204. In some embodiments, the structure of the portion 202 may be the same or similar to that in the semiconductor device 100. In other embodiments, the structure of the portion 202 may also be the same or similar to that in the semiconductor device 100'. In some embodiments, the portion 202 is suitable for use at a voltage of 500 V or higher. In some embodiments, the portion 202 is suitable for use at a voltage of 550 V or higher. In some embodiments, the portion 202 is suitable for use at a voltage of 600 V or higher. In some embodiments, the portion 204 is suitable for use at a voltage ranging from 10 to 40 V. In some embodiments, the portion 204 is suitable for use at a voltage that is relatively smaller than that of the portion 202.

A field plate is configured in the portion 202. No field plate is configured in the portion 204. The portion 202 can be formed on the superlattice layer 103. The portion 204 can be formed on the superlattice layer 103.

In some embodiments, the insulation region 128 may include a dielectric material. In some embodiments, the insulation region 128 may include a dielectric material of low dielectric constant (low k value). In some embodiments, the insulation region 128 may include a nitride, an oxide, or a fluoride. In some embodiments, the insulation region 128 may include silicon oxide, silicon nitride, silicon oxynitride, or fluorine-doped silicate glass (FSG).

FIGS. 8A, 8B, 8C, 8D, 8E, 8F, 8G, 8H, 8I, 8J, 8K, 8L and 8M illustrate several operations in manufacturing a semiconductor device according to certain embodiments of the present invention. Although FIGS. 8A through 8M depict several operations for fabricating the semiconductor device 200, similar operations can also be used to fabricate the semiconductor device 100 or 100'.

Referring to FIG. 8A, a substrate 102 is provided. In some embodiments, a superlattice layer 103 is disposed on the substrate 102. In some embodiments, the group III-V layer 105 is disposed on the substrate 102 via epitaxial growth.

In some embodiments, a doped group III-V layer 108' and a metal layer 110' are formed on the substrate 102. In some embodiments, the doped group III-V layer 108' can be formed by: epitaxial growth by metal organic chemical vapor deposition (MOCVD), and a dopant is doped therein. The metal layer 110' is then deposited on the doped group III-V layer 108'. In some embodiments, the metal layer 110 can be formed by physical vapor deposition (PVD), chemical vapor deposition (CVD), atomic layer deposition (ALD), plating, and/or other suitable deposition steps. It should be noted that the metal layer 110' is formed in a Gate First process, that is, before the source contact 118 and the drain contact 120 are formed.

Referring to FIG. 8B, a patterned hard mask 197 is formed over the metal layer 110'. The metal layer 110 can then be formed by removing a portion of the metal layer 110' by, for example, yellow lithography. In some embodiments, the patterned hard mask 197 may include, without limitation, silicon nitride (SiN), silicon oxynitride (SiON), silicon carbide (SiC), and the like. In some embodiments, the etching step may be performed by dry etching, wet etching, or a combination of dry and wet etching.

Figure 8C:
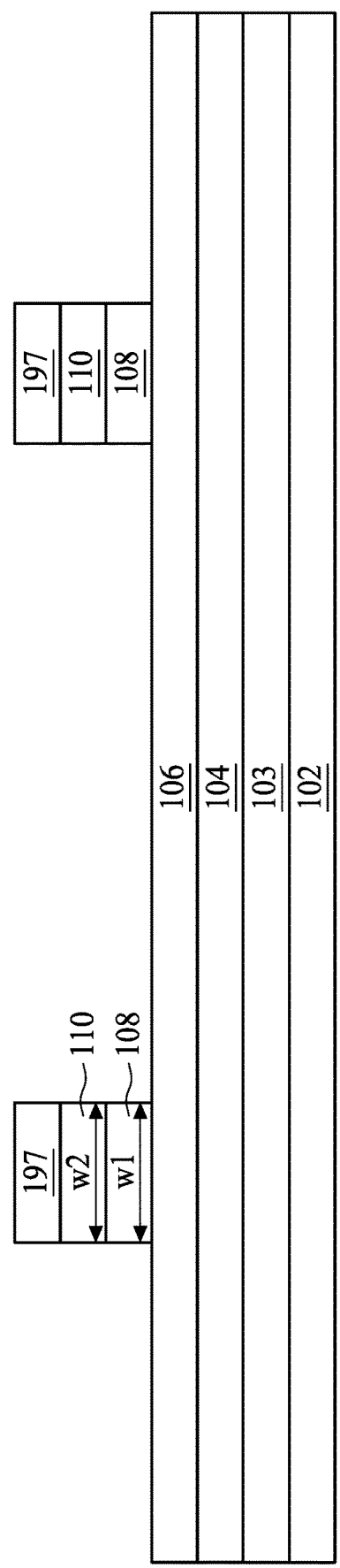
Figure 8D:
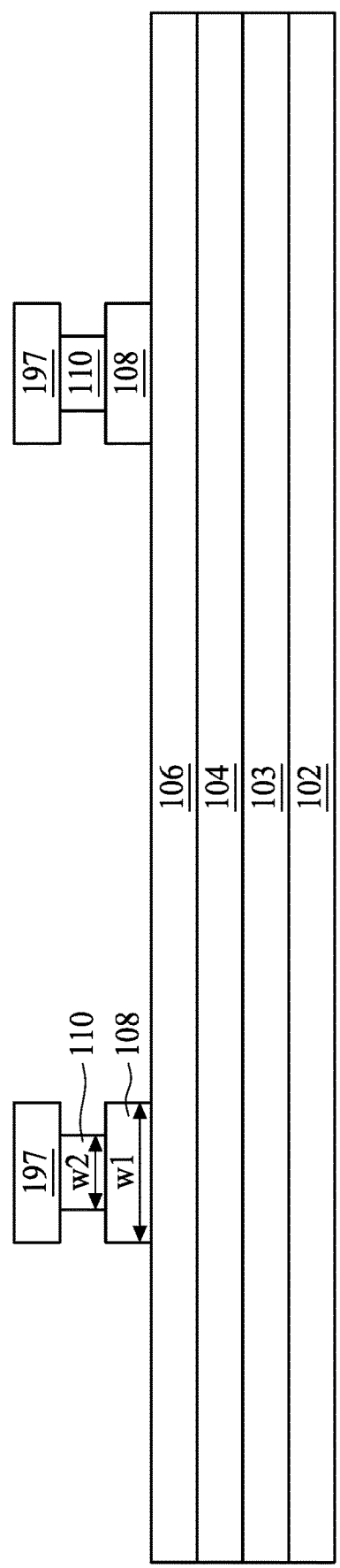

Referring to FIGS. 8C and 8D, the patterned hard mask 197 is further used as a mask to remove a portion of the doped group III-V layer 108' to form the doped group III-V layer 108. As previously mentioned, in a high voltage component, the distance between the drain contact 120 and the conductor structure 112 is typically greater than about 15 μm since the voltage tolerance is affected by the distance between the drain contact 120 and the conductor structure 112. As the width of the doped group III-V layer 108 becomes smaller, the ability to withstand high voltages increases with increasing distance between the drain contact 120 and the conductor structure 112 is, In addition, as the width of the doped group III-V layer 108 becomes smaller, the resistance of the high voltage component declines.

In FIG. 8C, as is in the semiconductor device 100', the width w1 of the doped group III-V layer 108 is substantially equal to the width w2 of the metal layer 110. In FIG. 8D, as is in the semiconductor device 100, the width w1 of the doped group III-V layer 108 is greater than the width w2 of the metal layer 110.

The feature that the width w1 of the doped group III-V layer 108 is greater than the width w2 of the metal layer 110 in FIG. 8D is formed by a self-aligned manufacturing process. Through the self-aligned manufacturing process, a doped group III-V layer 108 having a minimum critical dimension (CD) can be formed using only one mask. In some embodiments, the etchant for etching the metal layer 110 may be aqueous ammonia ($NH_4OH$), hydrogen peroxide ($H_2O_2$), sulfuric acid ($H_2SO_4$), hydrofluoric acid (HF), ammonium fluoride ($NH_4F$), or a mixture of the foregoing compounds. Anisotropic etching can be performed on the doped group III-V layer 108 by dry etching. By the different etching methods, a feature can be formed that the width w1 of the doped group III-V layer 108 is larger than the width w2 of the metal layer 110.

Figure 8F:
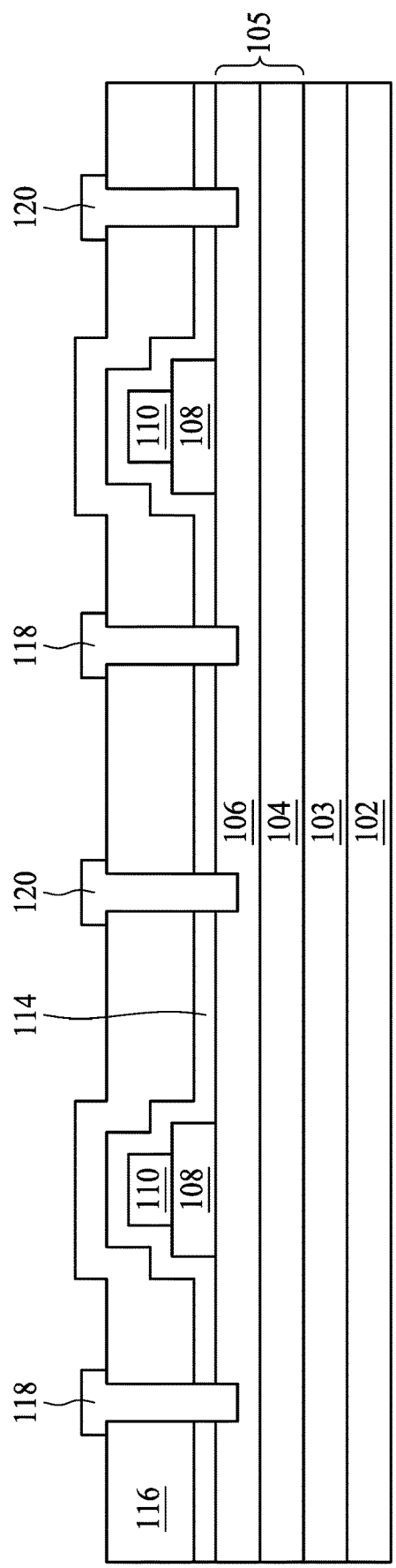

Referring to FIG. 8E, the patterned hard mask 197 is removed, and then the passivation layer 114 and the passivation layer 116 are formed on the metal layer 110. Referring to FIG. 8F, a source contact hole and a drain contact hole are formed and filled with a material to form the source contact 118 and the drain contact 120. In some embodiments, this involves multiple steps including yellow photolithography, etching, deposition, and others. The yellow lithography and etching include forming a patterned mask on the passivation layer 116 and etching the passivation layer 114, the passivation layer 116, and the group III-V layer 105 to form a source contact hole and a drain contact hole. A portion of the group III-V layer 105 is exposed from the bottoms of the source contact hole and the drain contact hole. A material is then filled into the holes by deposition steps such as CVD, PVD, and electroplating, etc. In some embodiments, after the material is filled into the holes, the deposited material is etched again through a mask to form a desired electrode structure. In some embodiments, the deposited material forms an intermetallic compound with the group III-V layer 105 through rapid thermal anneal (RTA), thereby forming an ohmic contact to the electron channel region 105a.

Figure 8G:
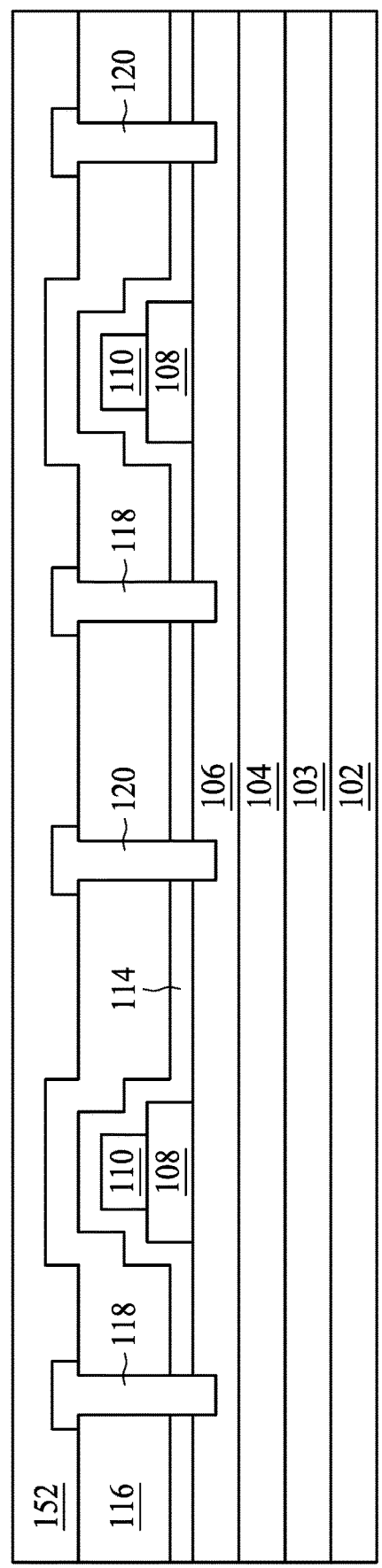

Referring to FIG. 8G, a dielectric layer 152 is deposited on the passivation layer 116. In some embodiments, the dielectric layer 152 (and the dielectric layers 154, 156, 158, 160, and 162) can be deposited by: CVD, high density plasma (HDP) CVD, spin-on, sputtering, and the like. The surface of the dielectric layer 152 is then treated by chemical-mechanical planarization (CMP).

Figure 8H:
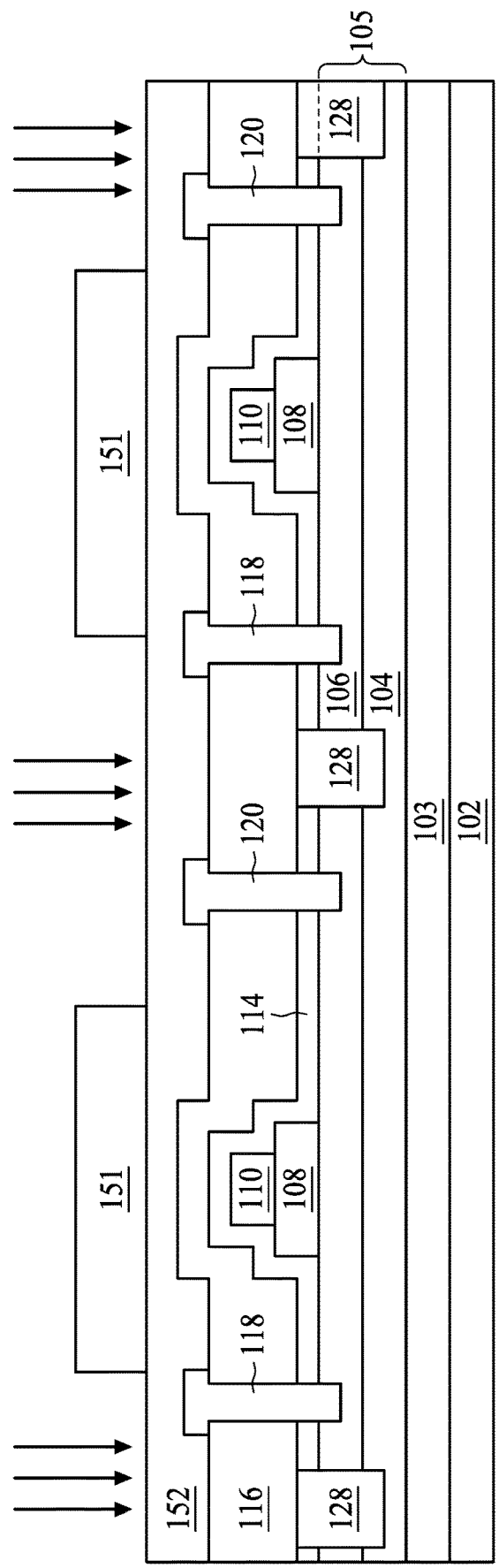

Referring to FIG. 8H, an insulation region 128 is formed to separate the source contact 118 and the drain contact 120 of the left and right components. In some embodiments, nitrogen, oxygen, or fluorine is implanted in an area not covered by a patterned photoresist 151 through an implant isolation process using the patterned photoresist 151, and these elements will remain in the group III-V layer 105, to block the electron channels on both sides.

Figure 8I:
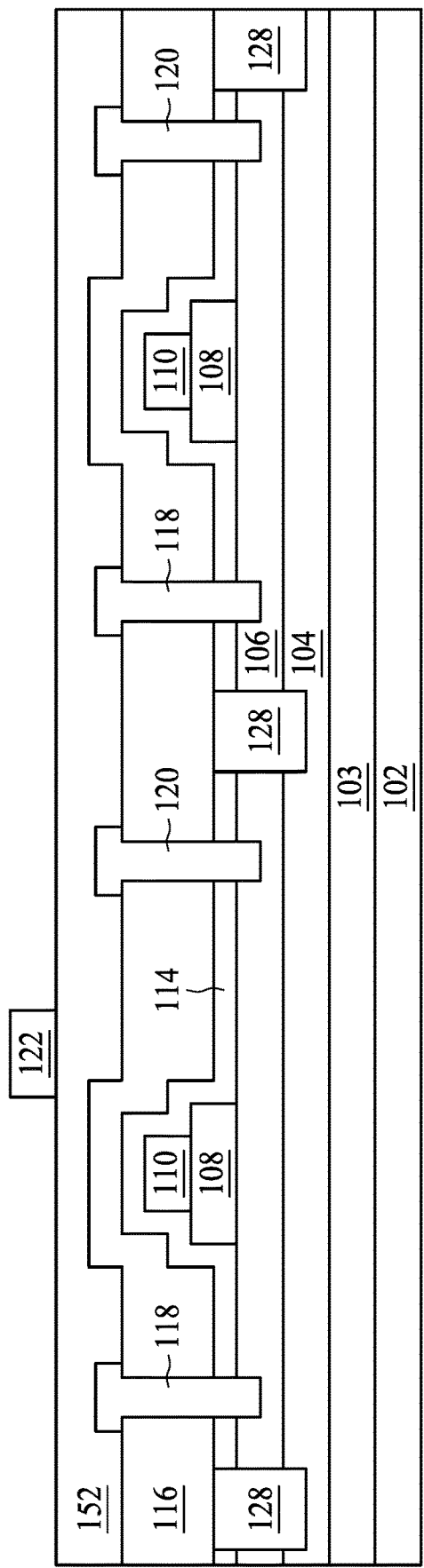

Referring to FIG. 8I, a field plate 122 is formed on the dielectric layer 152. The dielectric layer 152 separates the field plate 122 from the source contact 118 in the first direction (D1).

In some embodiments, the field plate 122 (including the field plates 124, 126, and 132) may be formed by depositing a conductor material and then patterning, for example, by depositing a metal by sputtering, and then patterning by dry etching. It should be noted that the position of the field plate 122 cannot be located at the position of the conductor structure 112 formed in the next step. In addition, since a relatively low voltage component is suitable for use at a low voltage, and the electric field between the conductor structures has little effect on the performance of the component, the field plate in the relatively low voltage component can be omitted.

Figure 8J:
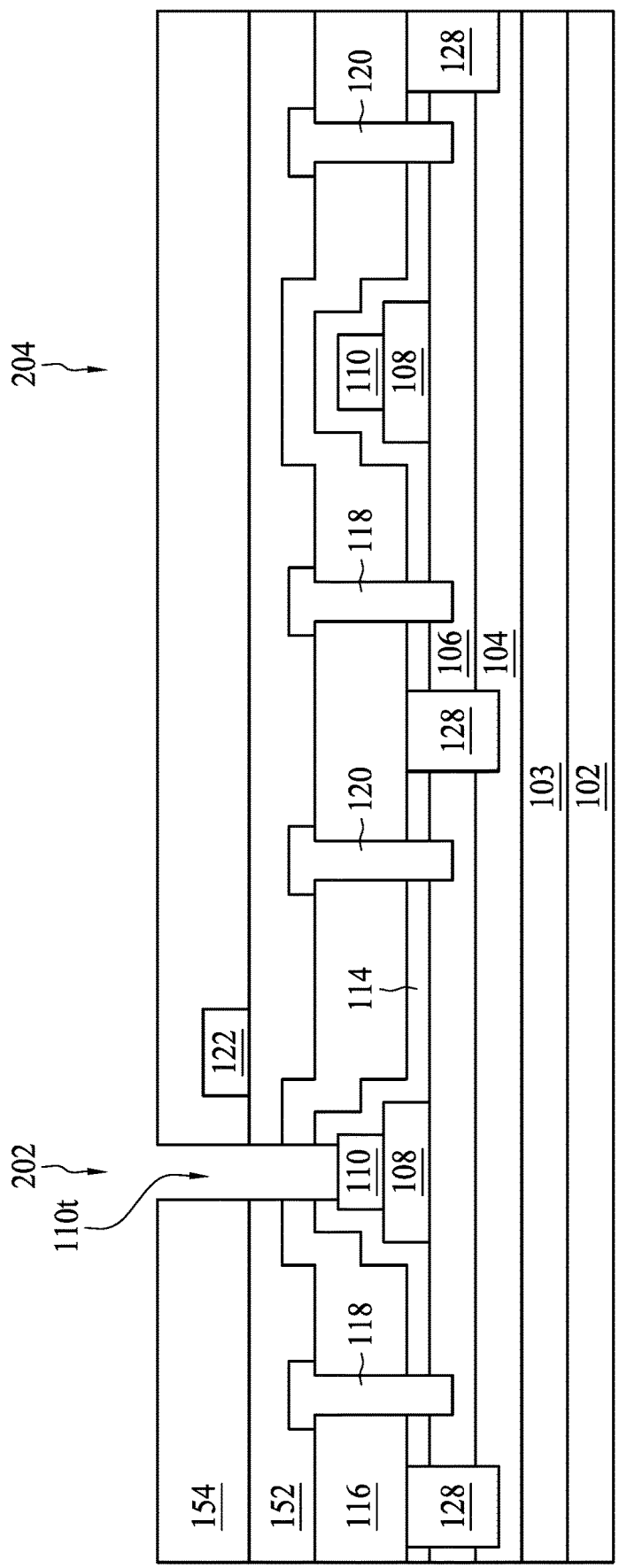

Referring to FIG. 8J, an opening 110t is formed. The opening 110t exposes a partial surface of the metal layer 110. In some embodiments, the opening 110t may be formed by dry etching or wet etching.

For example, wet etching includes exposure to a hydroxide containing solution, deionized water, and/or other etchants. Dry etching involves the use of inductively coupled plasma. The metal layer 110 can be used as a stop layer for the doped group III-V layer 108 in this step.

In the process of forming the semiconductor device 200, the first portion 202 and the second portion 204 are included. Before the process proceeds to form the formation region 128 (including the step of forming the insulation region 128), the first portion 202 and the second portion 204 have the same structure and flow, and the same components can be formed in the same step.

In some embodiments, the first portion 202 is a relatively high voltage component and the second portion 204 is a relatively low voltage component. The low-voltage component belongs to the Gate First process. After the insulation region 128 is formed therebetween, the opening 110t is not formed on the low voltage component and the conductor structure 112 is formed. The high-voltage component is a hybrid of the Gate First process and the Gate Last process. After the insulation region 128 is formed therebetween, the field plate 122, the opening 110t and the conductor structure 112 of the high voltage component are formed.

Figure 8K:
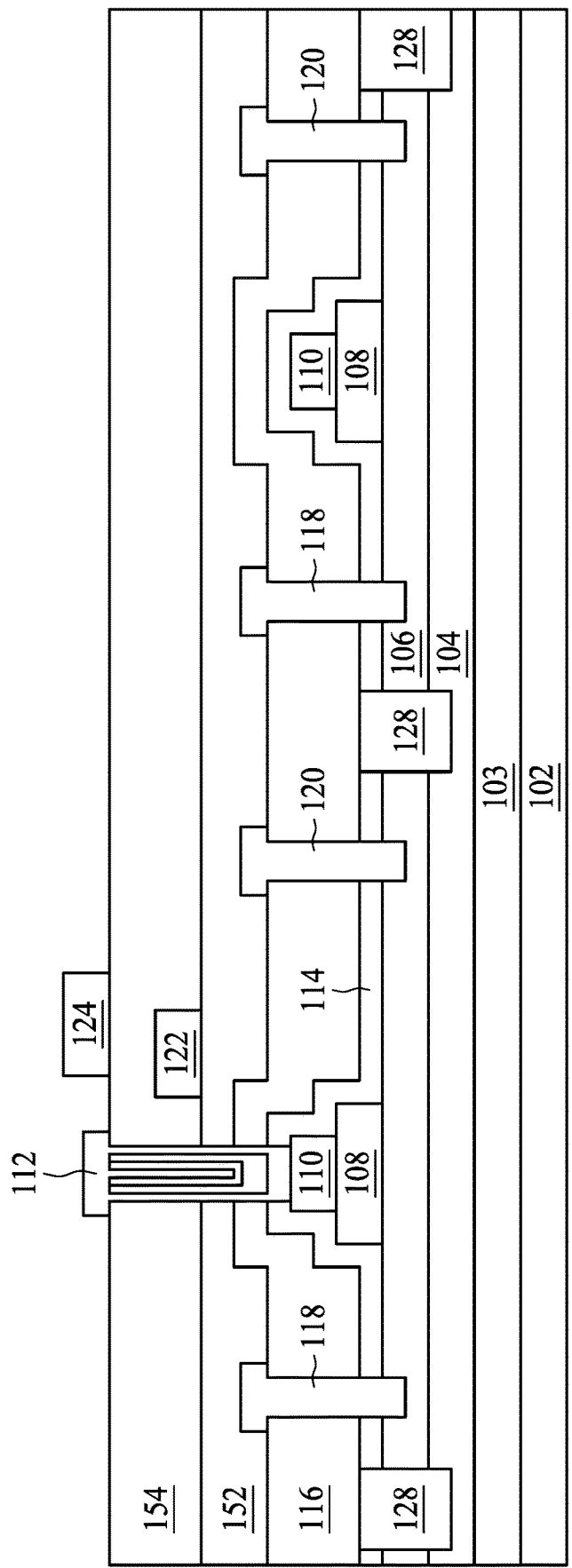

Referring to FIG. 8K, layers of the conductor structure 112 are deposited and filled into the opening 110t to form the conductor structure 112. The material selection for each layer of the conductor structure 112 has been described above and will not be described here again.

In some embodiments, the layers of the conductor structure 112 can be formed by PVD, CVD, ALD, electroplating, and/or other suitable steps. In some embodiments, after filling the layers of the conductor structure 112, the surface of the conductor structure 112 is not treated by CMP, so that the protrusions 113 (shown in FIG. 4) remain on the dielectric layer 154.

In some embodiments, the field plate 124 may be formed together with the conductor structure 112. In some embodiments, the field plate 124 may have the same material as the conductor structure 112.

Figure 8L:
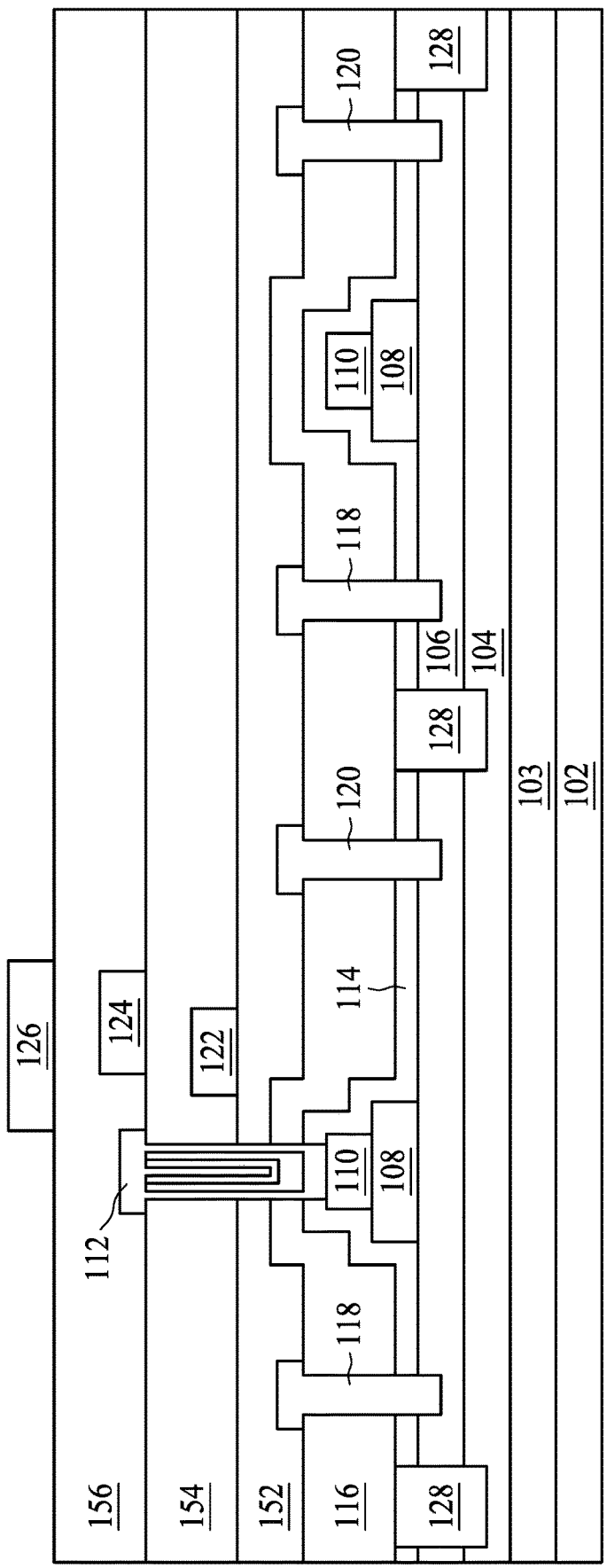

Referring to FIG. 8L, in some embodiments, the fabrication of the semiconductor devices 200, 100, and 100' further includes forming the dielectric layer 156 and the field plate 126.

Figure 8M:
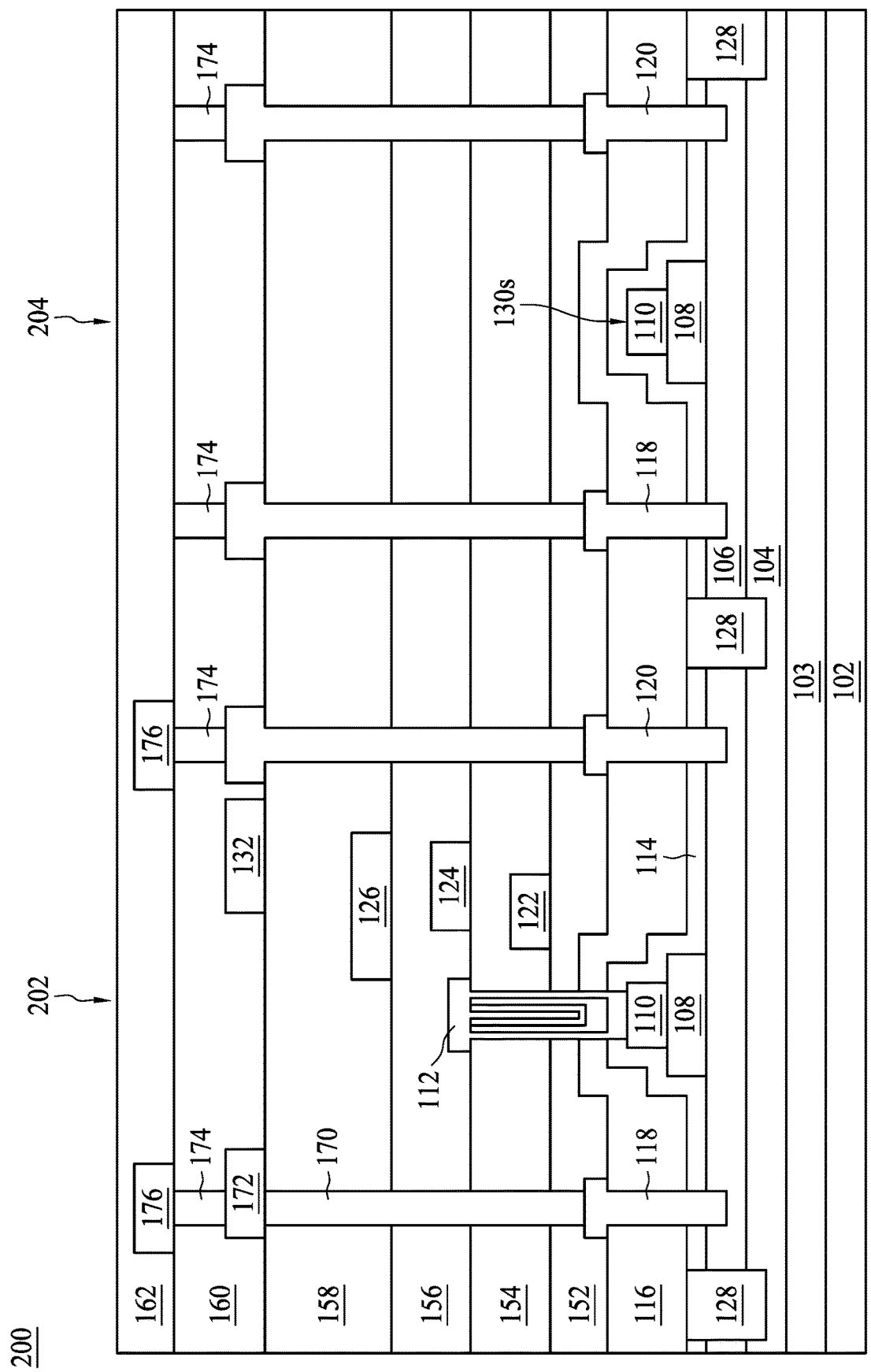

Referring to FIG. 8M, in some embodiments, the fabrication of the semiconductor devices 200, 100, and 100' further includes forming a dielectric layer 158 and forming an interconnect structure 170 running through the dielectric layers 158 to 152, and connected to the source contact 118 and the drain contact 120.

In some embodiments, the fabrication of the semiconductor devices 200, 100, and 100' further includes forming the metal layer 172 and the field plate 132 on the dielectric layer 158.

In some embodiments, the fabrication of the semiconductor devices 200, 100, and 100' further includes forming the dielectric layer 160 covering the metal layer 172 and the field plate 132. In some embodiments, the process flow 800 further includes forming the conductive via 174 that runs through the dielectric layer 160 to connect to the metal layer 172 or the interconnect structure 170. In some embodiments, the fabrication of the semiconductor devices 200, 100, and 100' further includes forming the metal layer 176 connected to the conductive via 174 and forming the dielectric layer 162 covering the metal layer 176.

Figure 9:
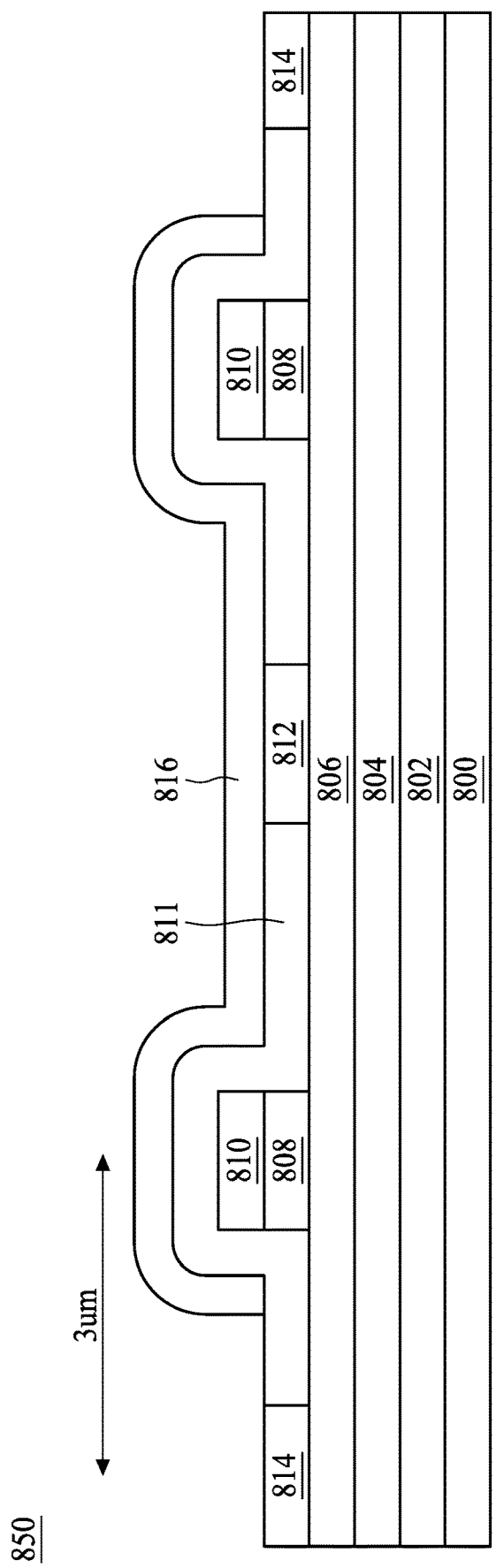
FIG. 9 shows a semiconductor device according to certain comparative embodiments of the present disclosure.

FIG. 9 shows a semiconductor device 850 according to certain comparative embodiments of the present disclosure. The semiconductor device 850 includes a substrate 800, a transition layer 802, an un-doped GaN buffer material 804, an un-doped AlGaN buffer material 806, a p-type GaN material 808, and a gate metal 810. The semiconductor device 850 also includes a source ohmic contact 812, a drain ohmic contact 814, a dielectric material 811, and a field plate 816.

The semiconductor device 850 can be used in relatively low voltage environments (e.g., 10V to 100V) or in relatively low voltage operations (where the thickness of the semiconductor device 850 (e.g., less than about 4 μm) is relatively small in a relatively low voltage environment). The semiconductor device 850 does not include a superlattice layer.

In the semiconductor device 850, in order to reduce the device resistance, the width of the gate structure 808 is usually about 0.5 μm or less, and the width of the gate metal layer 810 is usually about 0.4 μm or less. Therefore, if other conductors need to be provided over the gate metal layer 810, relatively complex processes or relatively sophisticated equipment (such as equipment that can achieve a relatively small critical dimension (CD)) are needed, and reduced yield or poor reliability of the product may be caused.

In addition, in a relatively low voltage environment (e.g. 10V-100V) or in a relatively low voltage operation (relatively low voltage environment), in order to further reduce the resistance of the device 850, the distance from the drain ohm contact 814 to the gate metal 810 of the semiconductor device 850 is generally 3 μm or less. With such a short distance, to reduce the electric field through the field plate 816, the field plate 816 needs to be as close as possible to the substrate 800, and the field plate 816 is normally in direct contact with and connected to the source ohmic contact 812, is led out from the source ohm contact 812, and spans over the gate metal 810. In such a configuration, it is preferred to maintain a headroom above the gate metal 810 (for example, no conductor is disposed at some distance above the gate metal 810). If other conductors are placed over the gate metal 810, the field plate 816 may be destroyed. Thus the performance of the device 850 is adversely affected.

Figure 10:
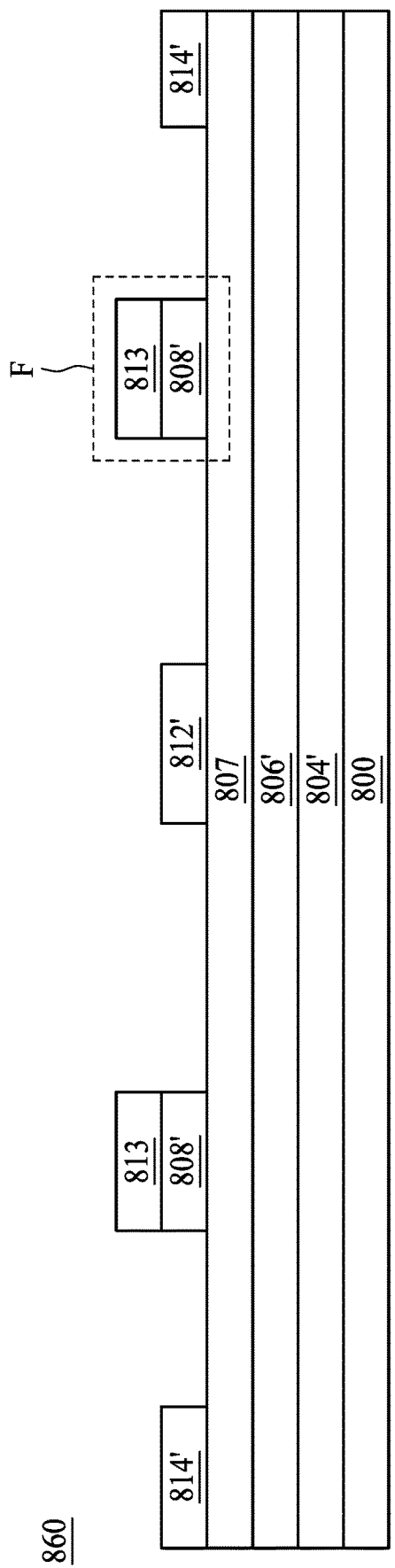
FIG. 10 shows another semiconductor device according to certain comparative embodiments of the present disclosure.

FIG. 10 shows another semiconductor device 860 according to certain comparative embodiments of the present disclosure. The semiconductor device 860 includes a substrate 800, an active layer 804', a channel layer 806', a barrier layer 807, a gate structure 808', and a gate electrode 813. The semiconductor device 860 also includes a source electrode 812' and a drain electrode 814'.

Similar to the semiconductor device 850, the semiconductor device 860 is a relatively low voltage (e.g., 10V to 100V) component that does not include a superlattice layer.

In the semiconductor device 860, the gate electrode 813 is in direct contact with the gate structure 808'. Because the two are in direct contact, during the process of exposing the gate structure 808' to form the gate electrode 813 thereabove, it may not be possible to prevent the formation of detects on the surface of the gate structure 808', resulting in leakage current.

Figure 10A:
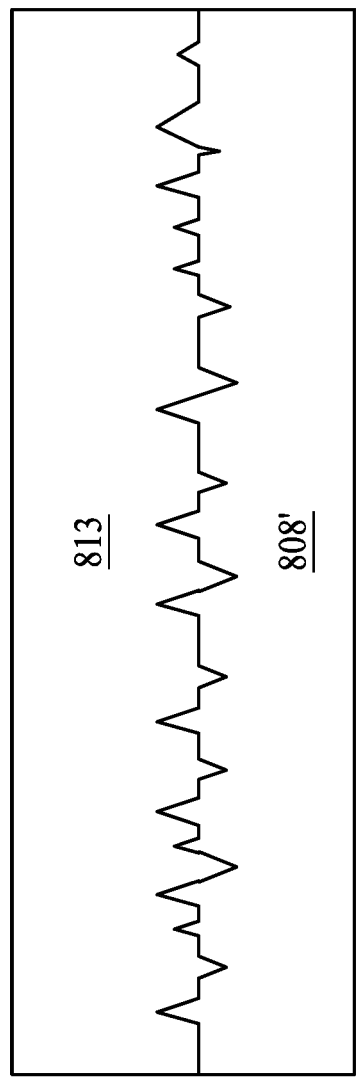
FIG. 10A is an enlarged view of the structure in the dashed line box F of FIG. 10.

FIG. 10A is an enlarged view of the structure in the dashed line box F in FIG. 10. There may be a relatively rough interface between the gate structure 808' and the gate electrode 813. There may be a relatively uneven interface between the gate structure 808' and the gate electrode 813.

The gate structure 808' can have a relatively rough surface. The gate structure 808' can have a relatively uneven surface. The gate electrode 813 can have a relatively rough surface. The gate electrode 813 can have a relatively uneven surface.

As used herein, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event of circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints, unless specified otherwise. The term "substantially coplanar" can refer to two surfaces within micrometers (μm) of lying along a same plane, such as within 10 μm, within 5 μm, within 1 μm, or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A GaN-based high electron mobility transistor (HEMT) semiconductor device, comprising:
   a substrate;
   a first group III-V layer disposed over the substrate;
   a second group III-V layer disposed over the first group III-V layer, wherein the second group III-V layer has a larger bandgap than that of the first group III-V layer;
   a doped group III-V layer disposed on the second group III-V layer;
   a metal layer disposed on the doped group III-V layer and covering a first portion of a top surface of the doped group III-V layer to form a first contact area, a second portion of the top surface of the doped III-V layer being not covered by the metal layer, the second portion of the top surface of the doped group III-V layer having a larger surface roughness than the first portion of the top surface of the doped group III-V layer;
   a first passivation layer disposed on the second group III-V layer, the doped group III-V layer, and the metal layer and covering the second portion of the top surface of the doped group III-V layer;
   a second passivation layer conformally disposed over the first passivation layer;
   a third passivation layer disposed over the second passivation layer;
   a conductor structure disposed on the doped group III-V layer and penetrating the first, second, and third passivation layers to make contact with the doped group III-V layer;
   a source contact and a drain contact laterally separated from the doped group III-V layer, wherein the source contact and the drain contact penetrate at least the first passivation layer to make contact with the second group III-V layer;
   a first field plate positioned over the third passivation layer;
   a fourth passivation layer positioned over the first field plate and over the third passivation layer;
   a second field plate positioned over the fourth passivation layer;
   a fifth passivation layer positioned over the second field plate and over the fourth passivation layer;
   a third field plate positioned over the fifth passivation layer;
   a sixth passivation layer positioned over the third field plate and over the fifth passivation layer; and
   at least two interconnect structures penetrating at least the third, fourth, fifth and sixth passivation layers to respectively contact the source contact and drain contact.

2. The GaN-based HEMT semiconductor device according to claim 1, wherein the source contact and the drain contact form respectively interfaces with the second group III-V layer at a position lower than the doped group III-V layer.

3. The semiconductor device according to claim 1, wherein the conductor structure has a body and an overhang which is connected to the body and located on the third passivation layer, and the body penetrates the first, second, and third passivation layers.

4. The semiconductor device according to claim 3, wherein the overhang has a width greater than that of the body and has an edge directly below the third field plate.

5. The semiconductor device according to claim 1, wherein the first passivation layer is conformal with the doped group III-V layer and the metal layer, such that the second passivation layer conformal with the first passivation layer has a first thickness on the metal and a second thickness separated from the metal and greater than the first thickness.

6. The semiconductor device according to claim 1, wherein the conductor structure comprises several heterojunction junctions.

7. The semiconductor device according to claim 1, wherein the doped group III-V layer has a first width in a width direction, and the metal layer has a second width in the width direction, wherein the second width is less than the first width.

8. The semiconductor device according to claim 1, wherein the conductor structure is in direct contact with the metal layer.

9. The semiconductor device according to claim 1, wherein the metal layer is in direct contact with the doped group III-V layer.

10. The semiconductor device according to claim 1, wherein the first passivation layer surrounds a portion of the conductor structure.

11. The semiconductor device according to claim 1, wherein first passivation layer is in direct contact with the second portion of the top surface of the doped group III-V layer, so as to form a second contact area.

12. The semiconductor device according to claim 1, wherein the second passivation layer surrounds a portion of the conductor structure.

13. The semiconductor device according to claim 1, wherein the first field plate is in a position that is higher than a bottom surface of the conductor structure and lower than a top surface of the conductor structure.

14. The semiconductor device according to claim 1, wherein the second field plate has a bottom surface that is in a position lower than the conductor structure and a bottom surface that is in a position higher than the conductor structure.

15. The semiconductor device according to claim 1, wherein one of the first, second, and third field plates at least vertically overlaps with another field plate.

16. The semiconductor device according to claim 1, wherein neither the first nor second field plate vertically overlaps the conductor structure.

17. The semiconductor device according to claim 1, wherein the third field plate at least vertically overlaps the conductor structure.

18. The semiconductor device according to claim 1, further comprising a superlattice layer disposed on the substrate.

19. A semiconductor device, comprising:
a superlattice layer;
a first portion, formed on the superlattice layer and comprising a semiconductor device according to claim 1;
a second portion, formed on the superlattice layer wherein the voltage of the second portion is less than that of the first portion; and
an insulation region, separating the first portion from the second portion.

20. A method for fabricating a semiconductor device, comprising:
forming a first group III-V layer over a substrate;
forming a second group III-V layer over the first group III-V layer, wherein the second group III-V layer has a larger bandgap than that of the first group III-V layer;
forming a doped group III-V layer on the second group III-V layer;
forming a metal layer on the doped group III-V layer, such that the metal layer covers a first portion of a top surface of the doped group III-V layer to form a first contact area, wherein a second portion of the top surface of the doped III-V layer is not covered by the metal layer, and the second portion of the top surface of the doped group III-V layer has a larger surface roughness than the first portion of the top surface of the doped group III-V layer;
forming a first passivation layer on the second group III-V layer, the doped group III-V layer, and the metal layer, wherein the first passivation layer covers the second portion of the top surface of the doped group III-V layer;
forming a second passivation layer conformal with and over the first passivation layer;
forming a third passivation layer over the second passivation layer;
forming a conductor structure on the doped group III-V layer, such that the conductor structure penetrates the first, second, and third passivation layers to make contact with the doped group III-V layer;
forming a source contact and a drain contact laterally separated from the metal layer, wherein the source contact and the drain contact penetrate at least the first passivation layer to make contact with the second group III-V layer;
forming a first field plate positioned over the third passivation layer;
forming a fourth passivation layer positioned over the first field plate and over the third passivation layer;
forming a second field plate positioned over the fourth passivation layer;
forming a fifth passivation layer positioned over the second field plate and over the fourth passivation layer;
forming a third field plate positioned over the fifth passivation layer;
forming a sixth passivation layer positioned over the third field plate and over the fifth passivation layer; and
forming at least two interconnect structures penetrating at least the third, fourth, fifth and sixth passivation layers to respectively contact the source contact and drain contact.

* * * * *